(12) United States Patent
Gopalakrishnan et al.

(10) Patent No.: US 11,107,518 B2
(45) Date of Patent: Aug. 31, 2021

(54) EXTENDING OPERATING TEMPERATURE OF STORAGE DEVICE

(71) Applicant: Western Digital Technologies, Inc., San Jose, CA (US)

(72) Inventors: Raghavendra Gopalakrishnan, Bangalore (IN); Joanna Lai, San Jose, CA (US); Dmitry Vaysman, San Jose, CA (US)

(73) Assignee: Western Digital Technologies, Inc., San Jose, CA (US)

(*) Notice: Subject to any disclaimer, the term of this patent is extended or adjusted under 35 U.S.C. 154(b) by 0 days.

(21) Appl. No.: 16/912,398

(22) Filed: Jun. 25, 2020

(65) Prior Publication Data

US 2021/0110866 A1 Apr. 15, 2021

Related U.S. Application Data

(63) Continuation of application No. 16/601,236, filed on Oct. 14, 2019.

(51) Int. Cl.
*G11C 11/406* (2006.01)
*G11C 29/52* (2006.01)
(Continued)

(52) U.S. Cl.
CPC ...... *G11C 11/40626* (2013.01); *G06F 3/0619* (2013.01); *G06F 3/0653* (2013.01);
(Continued)

(58) Field of Classification Search
CPC ....... G11C 7/04; G11C 8/10; G11C 11/40626; G11C 29/52; G06F 12/0238; G06F 3/0688; G06F 3/0653; G06F 3/0619
(Continued)

(56) References Cited

U.S. PATENT DOCUMENTS 7,752,381 B2 7/2010 Wong
8,677,203 B1 3/2014 Shalvi et al.
(Continued)

OTHER PUBLICATIONS

Notice of Allowance dated Aug. 14, 2020, U.S. Appl. No. 16/601,236, filed Oct. 14, 2019.
(Continued)

*Primary Examiner* — Michael T Tran
(74) *Attorney, Agent, or Firm* — Vierra Magen Marcus LLP

(57) ABSTRACT

A storage device having a wide range of operating temperatures is disclosed. Techniques disclosed herein may be used to operate MLC cells at higher temperatures before resorting to thermal throttling. Techniques disclosed herein may be used to operate MLC cells at lower temperatures without needing to pre-heat the storage device. SLC data stored in a first group of memory cells is folded to MLC data stored in a second group of memory cells while an operating temperature is outside a first temperature range. After the operating temperature is within a second temperature range, the data integrity of the MLC data is checked. The SLC data in the first group is folded to MLC data in a third group of memory cells responsive to the MLC data in the second group failing the data integrity check. The foregoing permits the storage device to increase its range in operating temperatures.

20 Claims, 18 Drawing Sheets

(51) Int. Cl.
*G06F 3/06* (2006.01)
*G06F 12/02* (2006.01)

(52) U.S. Cl.
CPC ........ *G06F 3/0688* (2013.01); *G06F 12/0238* (2013.01); *G11C 29/52* (2013.01)

(58) Field of Classification Search
USPC .............................................. 365/211, 230.06
See application file for complete search history.

(56) References Cited

U.S. PATENT DOCUMENTS

| | | | |
|---|---|---|---|
| 9,229,852 B2 | 1/2016 | Kandiraju et al. | |
| 9,691,473 B2 | 6/2017 | Yang et al. | |
| 9,880,752 B2 | 1/2018 | Reusswig et al. | |
| 9,922,714 B1 | 3/2018 | Yu et al. | |
| 9,952,784 B2* | 4/2018 | Sathyanarayan | G06F 3/0659 |
| 10,096,370 B1 | 10/2018 | Jean et al. | |
| 10,339,983 B1* | 7/2019 | Confalonieri | G11C 7/04 |
| 10,354,732 B2 | 7/2019 | Muchherla et al. | |
| 10,459,837 B2* | 10/2019 | Chiu | G06F 12/0246 |
| 10,559,369 B2* | 2/2020 | Jean | G11C 16/0483 |
| 10,635,400 B2* | 4/2020 | Sharon | G06F 12/14 |
| 10,635,585 B2* | 4/2020 | Kashyap | G06F 12/0246 |
| 10,698,839 B2* | 6/2020 | Ilani | G06F 21/79 |
| 10,725,705 B1* | 7/2020 | Eliash | G06F 3/0604 |
| 2011/0292724 A1* | 12/2011 | Kim | G11C 16/3459 365/185.03 |
| 2013/0031431 A1* | 1/2013 | Sharon | G11C 16/3481 714/719 |
| 2013/0297986 A1* | 11/2013 | Cohen | G06F 3/0676 714/763 |
| 2014/0059278 A1* | 2/2014 | Schuh | G11C 29/26 711/103 |
| 2014/0157086 A1* | 6/2014 | Sharon | G06F 12/00 714/773 |
| 2015/0006784 A1 | 1/2015 | Avila et al. | |
| 2015/0092488 A1 | 4/2015 | Wakchaure et al. | |
| 2016/0098216 A1 | 4/2016 | Huang et al. | |
| 2016/0117216 A1 | 4/2016 | Muchherla et al. | |
| 2016/0292092 A1* | 10/2016 | Gavens | G06F 13/4068 |
| 2017/0090822 A1 | 3/2017 | Yadav et al. | |
| 2017/0115884 A1 | 4/2017 | Bhalerao et al. | |
| 2018/0189135 A1 | 7/2018 | Naik et al. | |
| 2018/0293006 A1 | 10/2018 | Jeong | |
| 2018/0293022 A1 | 10/2018 | Park | |
| 2018/0294029 A1 | 10/2018 | Rao | |
| 2018/0300235 A1 | 10/2018 | Hu | |
| 2018/0301203 A1 | 10/2018 | Kim | |
| 2018/0336936 A1 | 11/2018 | Chae | |
| 2019/0066775 A1 | 2/2019 | Jean et al. | |
| 2019/0116668 A1 | 4/2019 | Moreno et al. | |
| 2019/0130983 A1 | 5/2019 | Singidi et al. | |
| 2019/0138240 A1 | 5/2019 | Gayen et al. | |
| 2019/0180793 A1* | 6/2019 | Berman | G11C 7/04 |
| 2020/0004671 A1* | 1/2020 | Neufeld | G06F 3/0644 |
| 2020/0004679 A1 | 1/2020 | Szubbocsev et al. | |
| 2020/0005878 A1* | 1/2020 | Lu | G11C 11/5671 |
| 2020/0097211 A1 | 3/2020 | Alsasua et al. | |
| 2020/0142590 A1 | 5/2020 | Chew et al. | |
| 2020/0210586 A1 | 7/2020 | Cariello | |
| 2020/0242030 A1 | 7/2020 | Yoon et al. | |
| 2020/0249875 A1 | 8/2020 | Zhou et al. | |
| 2020/0250030 A1 | 8/2020 | Sandell et al. | |
| 2020/0250082 A1 | 8/2020 | Park | |
| 2020/0252072 A1 | 8/2020 | Wu | |
| 2020/0371861 A1 | 11/2020 | Chen et al. | |
| 2021/0049101 A1 | 2/2021 | Ray et al. | |
| 2021/0061297 A1 | 3/2021 | Troia | |
| 2021/0064257 A1 | 3/2021 | Cariello | |
| 2021/0064295 A1 | 3/2021 | Yu et al. | |

OTHER PUBLICATIONS

U.S. Appl. No. 16/364,054, filed Mar. 25, 2019 entitled "Smart mapping table update post background operations.".
U.S. Appl. No. 16/601,236, filed Oct. 14, 2019.
First Action Interview Pilot Program Pre-Interview Communication dated Jun. 18, 2020, U.S. Appl. No. 16/601,236, filed Oct. 14, 2019.
Amendment dated Nov. 13, 2020, U.S. Appl. No. 16/601,236, filed Oct. 14, 2019.
Non-Final Office Action dated Nov. 23, 2020, U.S. Appl. No. 16/601,236, filed Oct. 14, 2019.
Response to Office Action dated Feb. 16, 2021, U.S. Appl. No. 16/601,236, filed Oct. 14, 2019.
Notice of Allowance dated Mar. 23, 2021, U.S. Appl. No. 16/601,236, filed Oct. 14, 2019.

* cited by examiner

EXTENDING OPERATING TEMPERATURE OF STORAGE DEVICE

CLAIM OF PRIORITY

This application is a continuation application of U.S. patent application Ser. No. 16/601,236, entitled "EXTENDING OPERATING TEMPERATURE OF STORAGE DEVICE," by Gopalakrishnan et al., filed Oct. 14, 2019, published as U.S. 2021/0110865 on Apr. 15, 2021 and issued as U.S. Pat. No. 11,062,756 on Jul. 13, 2021, and incorporated herein by reference in its entirety.

BACKGROUND

Many electronic devices make use of an embedded or otherwise connected storage devices. Often, the embedded or connected storage device includes non-volatile memory. A host refers to a device that makes use of a storage device. A host can be connected to the storage device, or the storage device can be embedded within the host. Examples of host systems include smartphones, laptops, desktop computers, servers, smart appliances, digital cameras, video cameras, etc.

A non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), and others. One example of a storage device that uses semiconductor based non-volatile memory is a solid state device ("SSD").

Non-volatile storage devices, such as SSDs, have become more popular and are now being used with more applications. Users of SSDs and other storage devices desire high performance (e.g., fast write and read operation times).

BRIEF DESCRIPTION OF THE DRAWINGS

Like-numbered elements refer to common components in the different Figures.

DETAILED DESCRIPTION

Figure 1A:
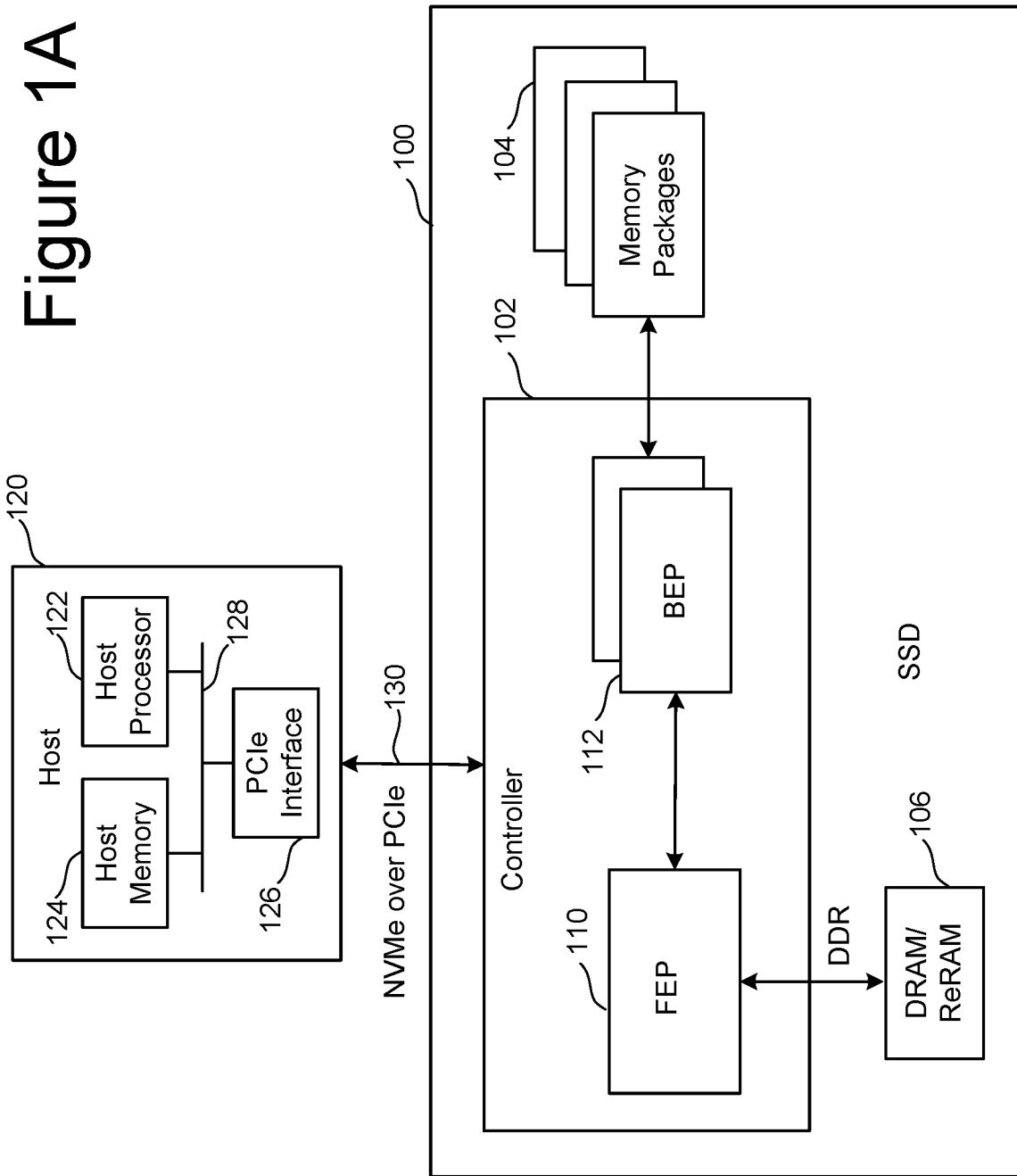
FIG. 1A is a block diagram of one embodiment of a storage device connected to a host.

Techniques are disclosed herein for operating non-volatile storage. The basic unit of storage in non-volatile storage systems is a memory cell. In some embodiments, memory cells store one bit of data and are referred to as Single Level Cells ("SLC"). An SLC memory cell can either be in an erased data state or a programmed data state. In other embodiments, memory cells store multiple bits of data and are referred to as Multi Level Cells ("MLC"). MLC memory cells can store two bits of data per memory cell, three bits of data per memory cell, four bits of data per memory cell, etc. An MLC memory cell can be in an erased data state or any one of multiple programmed data states. For example, an MLC memory cell that stores three bits of data (referred to as a three level cell—TLC), can be in an erased data state or any one of seven programmed data states. Because SLC memory cells only have two valid data states (erased and programmed), there is more margin between data states and less precision is required; therefore, SLC memory cells can be operated faster. MLC memory cells are typically operated slower so that they can be more precisely programmed into any one of multiple programmed data states.

To increase performance experienced by a user, some storage devices will first program data into SLC memory cells. Subsequently, in the background or when the storage device is idle, the storage device will re-write the data from the SLC memory cells to MLC memory cells, which allows the data to be stored more compactly so that the storage device is able to store more data. This process of moving the data from SLC memory cells to MLC memory cells is referred to herein as a folding SLC data to MLC data.

Storage devices typically support a range of operating temperature. In the event that the operating temperature is below the supported range, the storage device may execute dummy memory reads in order to heat the storage device to the supported range. In the event that the operating temperature is above the supported range, the storage device may employ thermal throttling to reduce the operating temperature. One technique for thermal throttling is to delay the execution of memory array operations that are pending. Therefore, thermal throttling may reduce performance.

For some storage devices, SLC memory cells support a wider range in operating temperature than MLC cells. For example, the storage device may support a range of −5 to 85 degrees Celsius (C) for SLC memory cells, whereas the storage device may support a range of 0 to 70 degrees C. for MLC memory cells. For some technologies, the temperature range for MLC memory cells is limited to a spread of, for example, 70 degrees C. However, for some technologies, the lower and upper bounds of the temperature range may be a design selection. For example, the temperature range may be 0 to 70 degrees C., 5 to 75 degrees C., or 10 to 80 degrees C.

A factor in the temperature range being limited is that programming MLC cells at one temperature and reading the MLC cells at a significantly different temperature could result in excessive errors. Such errors may arise due to the temperature dependence of the state of the MLC cells. For example, memory cells whose state depends on the threshold voltage of a transistor may exhibit such temperature dependence. Memory cells whose state depends on other factors, such as resistance, may also exhibit such temperature dependence. The state of SLC cells may also be impacted by temperature. However, SLC cells typically have a larger gap between states, thereby lessening the impact of temperature dependence of the state.

If a choice is made to permit the MLC cells to be operated at a lower range, such as 0 to 70 degrees C., then the storage device may need to employ thermal throttling whenever the operating temperature is above 70 degrees (for memory operations involving MLC cells). If a choice is made to permit the MLC cells to be operated at a higher range, such as 10 to 80 degrees C., then the storage device may need to use some form of heating whenever the operating temperature is below 10 degrees (to permit memory operations involving MLC cells).

Techniques are disclosed herein to increase the range of operating temperatures of a storage device. Techniques disclosed herein may be used to operate MLC cells at higher temperatures before resorting to thermal throttling. Techniques disclosed herein may be used to operate MLC cells at lower temperatures without needing to pre-heat the storage device. Techniques disclosed herein may be used to both operate MLC cells at higher temperatures before resorting to thermal throttling and to operate MLC cells at lower temperatures without needing to pre-heat the storage device.

In one embodiment, SLC data stored in a first group of non-volatile memory cells at one bit per memory cell is folded to MLC data stored in a second group of non-volatile memory cells at multiple bits per memory cell while an operating temperature is outside a first temperature range. As a few examples, this first temperature range might be 0 to 70 degrees C., 5 to 75 degrees C., 10 to 80 degrees C., etc. After the operating temperature is within a second temperature range, the data integrity of the MLC data in the second group is checked. The second temperature range is within the first temperature range. The SLC data in the first group is folded to MLC data in a third group of non-volatile memory cells in the storage device responsive to the MLC data in the second group failing the data integrity check. The foregoing permits the storage device to increase its range in operating temperatures.

Herein, a second temperature range is within a first temperature range if the second temperature range does not contain a temperature that is not in the first temperature range. The second temperature range could be co-extensive with the first temperature range. In other words, the second temperature range could be the same as the first temperature range. In one embodiment, the lowest temperature in the second temperature range is higher than the lowest temperature in the first temperature range. In one embodiment, the highest temperature in the second temperature range is lower than the highest temperature in the first temperature range.

FIG. 1A is a block diagram of one embodiment of a storage device 100 connected to a host 120. Storage device 100 can implement the technology proposed herein. Many different types of storage devices can be used with the technology proposed herein. One example storage device is a solid state device (SSD); however, other types of storage devices can also be used. Storage device 100 comprises a Controller 102, non-volatile memory 104 for storing data, and local memory (e.g. DRAM/ReRAM) 106. Controller 102 comprises a Front End Processor Circuit (FEP) 110 and one or more Back End Processor Circuits (BEP) 112. In one embodiment FEP110 circuit is implemented on an ASIC. In one embodiment, each BEP circuit 112 is implemented on a separate ASIC. The ASICs for each of the BEP circuits 112 and the FEP circuit 110 are implemented on the same semiconductor such that the Controller 102 is manufactured as a System on a Chip (SoC). FEP 110 and BEP 112 both include their own processors. In one embodiment, FEP110 and BEP 112 work as a master slave configuration where the FEP 110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage device). The BEP circuit 112 manages memory operations in the memory packages/die at the request of FEP circuit 110. For example, the BEP circuit 112 can carry out the read, erase and programming processes. Additionally, the BEP circuit 112 can perform buffer management, set specific voltage levels required by the FEP circuit 110, perform error correction, control the Toggle Mode interfaces to the memory packages, etc. In one embodiment, each BEP circuit 112 is responsible for its own set of memory packages. Controller 102 is one example of a control circuit.

In one embodiment, non-volatile memory 104 comprises a plurality of memory packages. Each memory package includes one or more memory die. Therefore, Controller 102 is connected to one or more non-volatile memory die. In one embodiment, each memory die in the memory packages 104 utilize NAND flash memory (including two dimensional NAND flash memory and/or three dimensional NAND flash memory). In other embodiments, the memory package can include other types of memory.

Controller 102 communicates with host 120 via an interface 130 that implements NVM Express (NVMe) over PCI Express (PCIe). For working with storage device 100, host 120 includes a host processor 122, host memory 124, and a PCIe interface 126 connected to bus 128. Host memory 124 is the host's physical memory, and can be DRAM, SRAM, non-volatile memory or another type of storage. Host 120 is external to and separate from storage device 100. In one embodiment, storage device 100 is embedded in host 120. Any combination of one or more of storage device 100, controller 102, FEP 110, BEP 112, and/or memory packages 104 may be referred to herein as an apparatus. In operation, when the host 120 needs to read data from or write data to the non-volatile memory 104, it will communicate with the controller 102. If the host 120 provides a logical address to which data is to be read/written, the controller can convert the logical address received from the host to a physical address in the non-volatile memory 104.

Figure 1B:
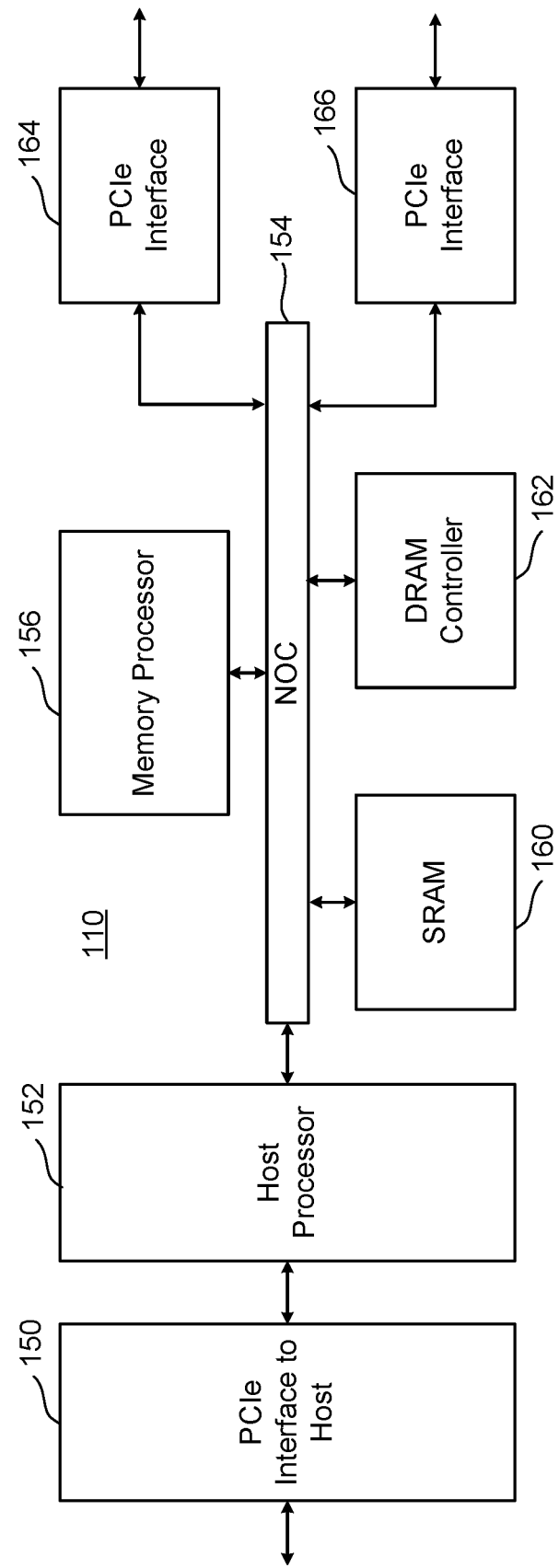
FIG. 1B is a block diagram of one embodiment of a Front End Processor Circuit. In some embodiments, the Front End Processor Circuit is part of a Controller.

FIG. 1B is a block diagram of one embodiment of FEP circuit 110. FIG. 1B shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, the SSD controller will include two BEP circuits 112; therefore there are two PCIe Interfaces 164/166. Each PCIe Interface communicates with one of the BEP circuits 112. In other embodiments, there can be more or less than two BEP circuits 112; therefore, there can be more than two PCIe Interfaces.

Figure 1C:
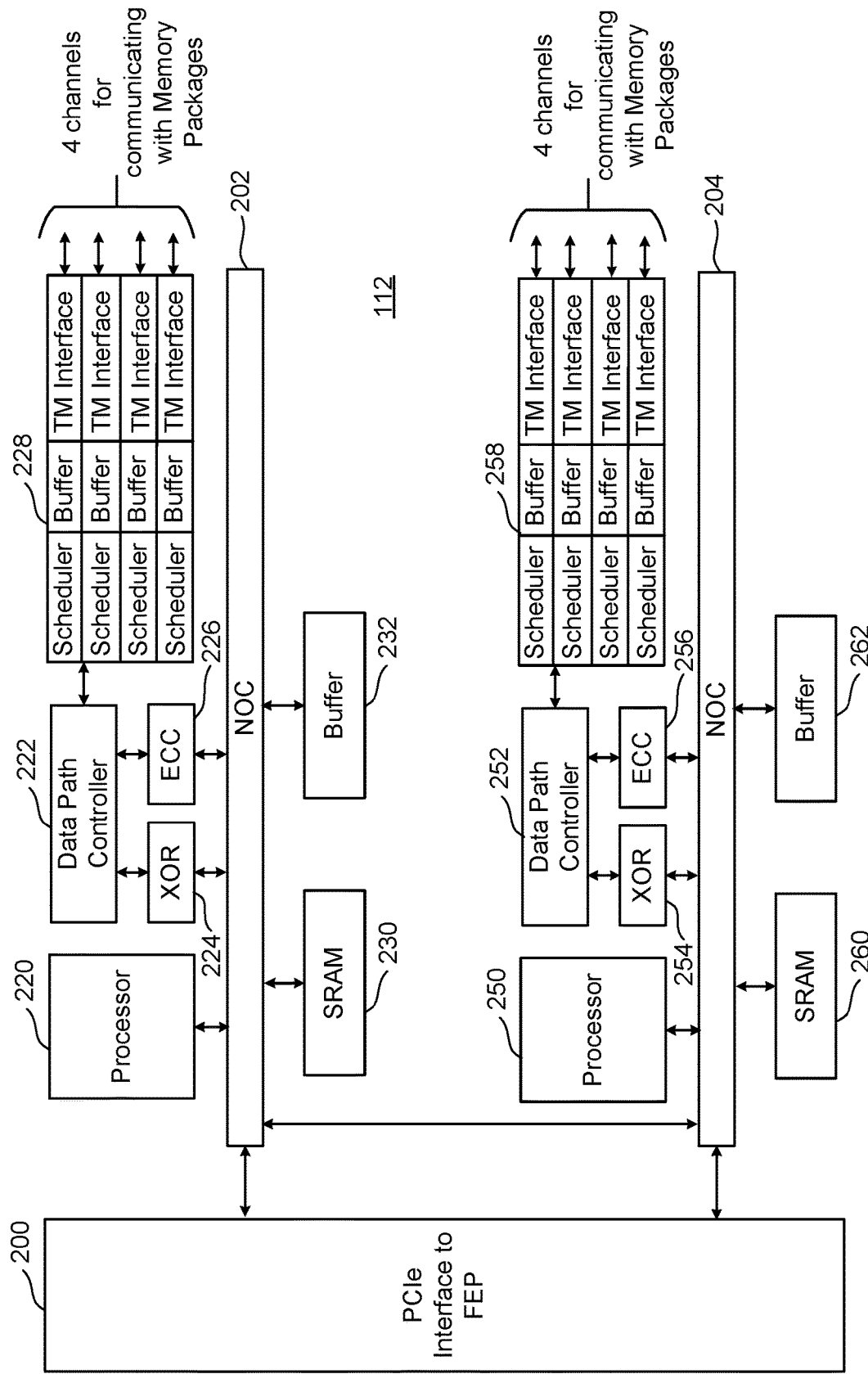
FIG. 1C is a block diagram of one embodiment of a Back End Processor Circuit. In some embodiments, the Back End Processor Circuit is part of a Controller.

FIG. 1C is a block diagram of one embodiment of the BEP circuit 112. FIG. 1C shows a PCIe Interface 200 for communicating with the FEP circuit 110 (e.g., communicating with one of PCIe Interfaces 164 and 166 of FIG. 2). PCIe Interface 200 is in communication with two NOCs (Network-on-a-Chip) 202 and 204. In one embodiment, the two NOCs can be combined to one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined and stored in a manner that can be recovered in case there is a UECC failure. In an embodiment, XOR engines 224/254 form a bitwise XOR of different pages of data. The XOR result may be stored in a memory package 104. In the event that an ECC engine 226/256 is unable to successfully correct all errors in a page of data that is read back from a memory package 104, the stored XOR result may be accessed from the memory package 104. The page of data may then be recovered based on the stored XOR result, along with the other pages of data that were used to form the XOR result.

Data path controller 22 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

Interfaces 228/258, alone or in combination, may be referred to as a memory interface configured to be connected to non-volatile memory (e.g., memory package 104). A combination of one or more of processor 220/250, data path controller 222/252, XOR 224/254, ECC 226/256 may be referred to herein as a processor circuit. The buffer 232/262, SRAM 230/260, and/or NOCs 202/204 may also be considered to be a part of the processor circuit.

Figure 1D:
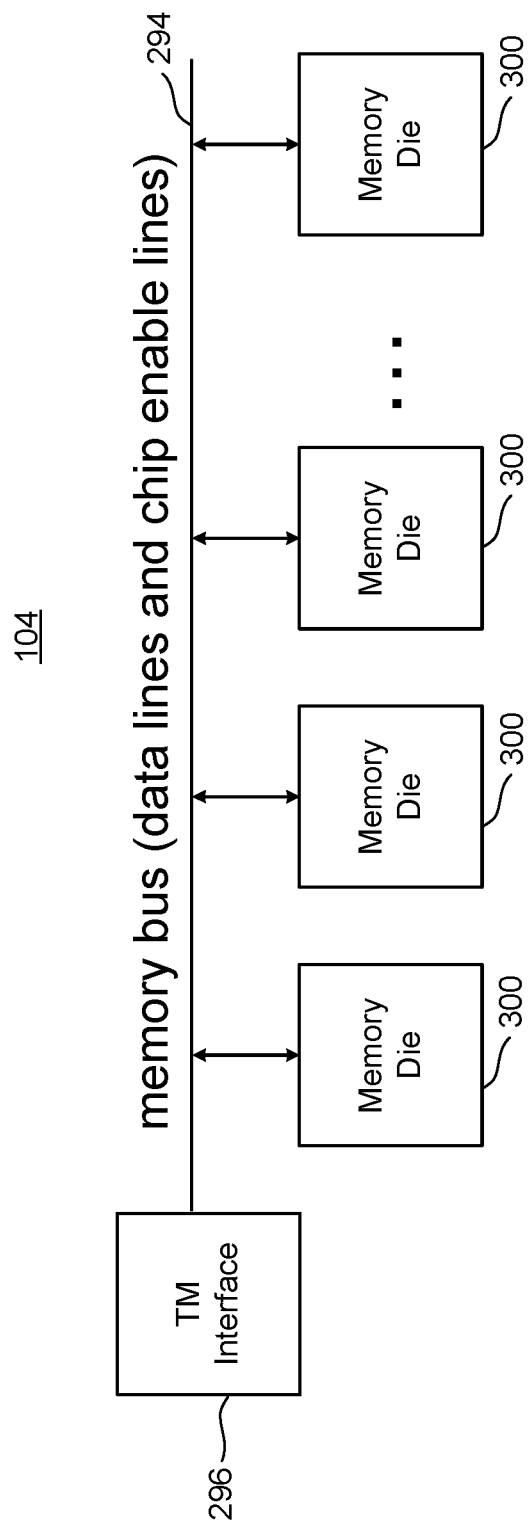
FIG. 1D is a block diagram of one embodiment of a memory package.

FIG. 1D is a block diagram of one embodiment of a memory package 104 that includes a plurality of memory die 300 connected to a memory bus (data lines and chip enable lines) 294. The memory bus 294 connects to a Toggle Mode Interface 296 for communicating with the TM Interface of a BEP circuit 112 (see e.g., FIG. 1C). In some embodiments, the memory package can include a small controller connected to the memory bus and the TM Interface. The memory package can have one or more memory die. In one embodiment, each memory package includes eight or 16 memory die; however, other numbers of memory die can also be implemented. The technology described herein is not limited to any particular number of memory die.

Figure 2:
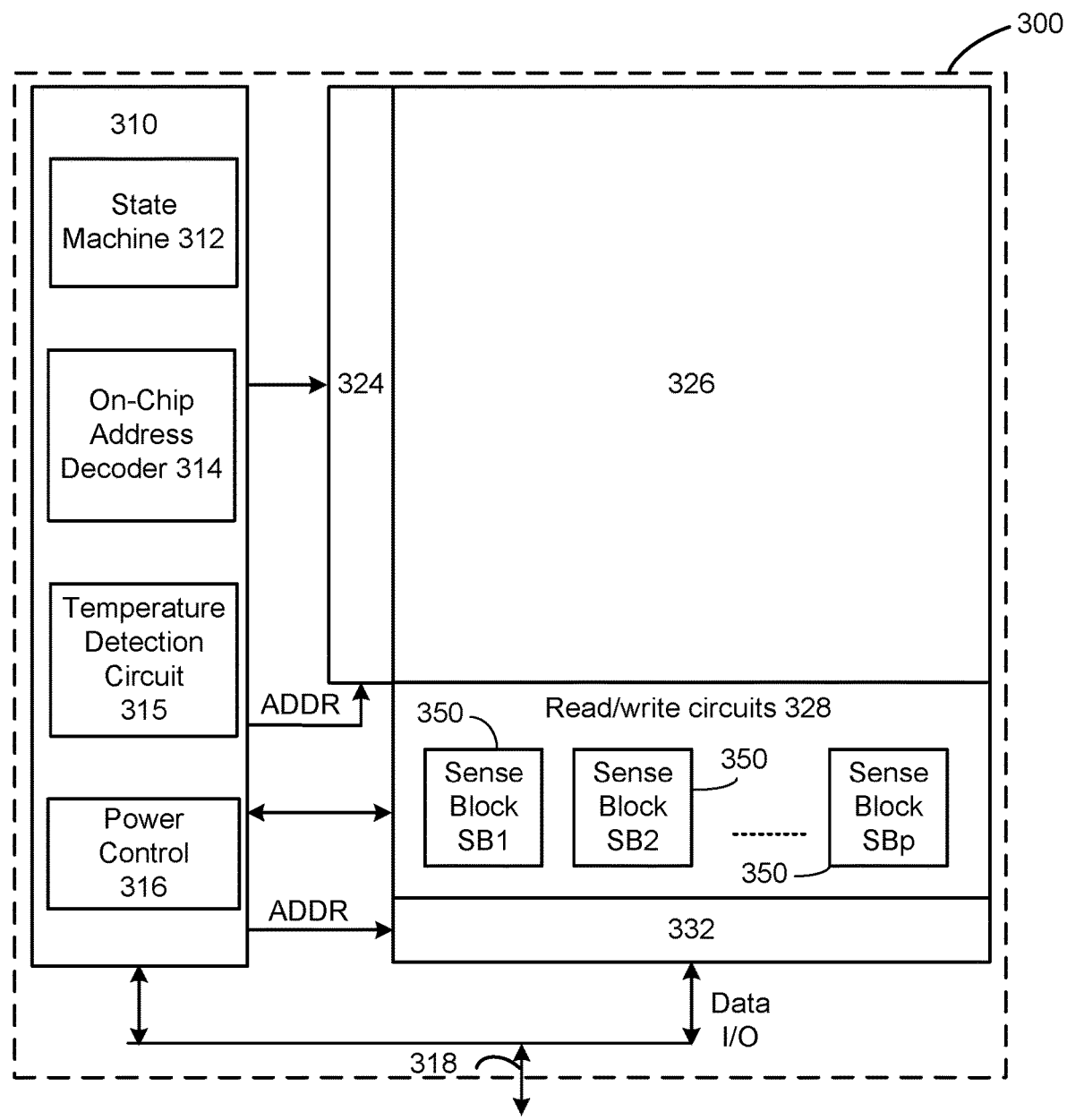
FIG. 2 is a block diagram of one embodiment of a memory die.

FIG. 2 is a functional block diagram of one embodiment of a memory die 300. Each of the one or more memory die 300 of FIG. 1D can be implemented as memory die 300 of FIG. 2. The components depicted in FIG. 2 are electrical circuits. In one embodiment, each memory die 300 includes a memory structure 326, control circuitry 310, and read/write circuits 328, all of which are electrical circuits. Memory structure 326 is addressable by word lines via a row decoder 324 and by bit lines via a column decoder 332. The read/write circuits 328 include multiple sense blocks 350 including SB1, SB2, . . . , SBp (sensing circuitry) and allow a page (or multiple pages) of data in multiple memory cells to be read or programmed in parallel. In one embodiment, each sense block include a sense amplifier and a set of latches connected to the bit line. The latches store data to be written and/or data that has been read. The sense blocks include bit line drivers.

Commands and data are transferred between the controller 102 and the memory die 300 via memory die interface 318. Examples of memory die interface 318 include a Toggle Mode Interface and an Open NAND Flash Interface (ONFI). Other I/O interfaces can also be used.

Control circuitry 310 cooperates with the read/write circuits 328 to perform memory operations (e.g., write, read, erase, and others) on memory structure 326. In one embodiment, control circuitry 310 includes a state machine 312, an on-chip address decoder 314, a power control module 316, and a temperature detection circuit 315. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced by a microcontroller or microprocessor. In one embodiment, control circuitry 310 includes buffers such as registers, ROM fuses and other storage devices for storing default values such as base voltages and other parameters.

The default values and other parameters could be stored in a region of the memory structure 326.

The temperature detection circuit 315 is configured to measure temperature on the memory die 300. The memory die 300 reports temperature information to the memory controller 102. In some embodiments, the memory controller 102 is configured to regulate the temperature of the storage device 100. Operating the storage device 100 at a temperature above a critical temperature may result in failure of the storage device 100 to retain data or perhaps even damage the storage device 100. Therefore, to prevent such negative consequences from happening, in embodiments that monitor temperature of the storage device 100, or monitor temperature of one or more portions or components of the storage device 100 (e.g., using temperature detection circuit 315 on memory dies 300), a threshold temperature that is below the critical temperature is used as threshold temperature. In some embodiments that measure temperature at more than one location within the storage device, e.g., by measuring temperature of two or more memory die 300, the highest measured temperature of the two or more portions or components of the storage device is used as the measured temperature. In some other embodiments, an average or other combination of the measured temperatures of the two or more portions or components of the storage device 100 is used as the measured temperature.

The on-chip address decoder 314 provides an address interface between addresses used by controller 102 to the hardware address used by the decoders 324 and 332. Power control module 316 controls the power and voltages supplied to the word lines and bit lines during memory operations. Power control module 316 may include charge pumps for creating voltages.

For purposes of this document, control circuitry 310, alone or in combination with read/write circuits 328 and decoders 324/332, comprise a control circuit connected to memory structure 326. This control circuit is an electrical circuit that performs the functions described below in the flow charts. In other embodiments, the control circuit can consist only of controller 102 (or other controller), which is an electrical circuit in combination with software (e.g., firmware), that performs the functions described below in the flow charts. In one embodiment, the control circuit is the controller where the controller is an electrical circuit that does not use hardware. In another alternative, the control circuit comprises controller 102 and control circuitry 310 performing the functions described below in the flow charts. In another embodiment, the control circuit comprises state machine 312 (and/or a microcontroller and/or microprocessor) alone or in combination with controller 102. In another alternative, the control circuit comprises controller 102, control circuitry 310, read/write circuits 328 and decoders 324/332 performing the functions described below in the flow charts. In other embodiments, the control circuit comprises one or more electrical circuits that operate the non-volatile memory. The term apparatus as used herein may include, but is not limited to, memory die 300, non-volatile memory 104, storage device 100, or a host system 120 that includes a storage device 100.

In one embodiment, memory structure 326 comprises a monolithic three-dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 326 comprise vertical NAND strings with charge-trapping material such as described, for example, in U.S. Pat. No. 9,721,662, incorporated herein by reference in its entirety. In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A storage device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a $Ge_2Sb_2Te_5$ alloy to achieve phase changes by electrically heating the phase change material. The doses of programming are electrical pulses of different amplitude and/or length resulting in different resistance values of the phase change material.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
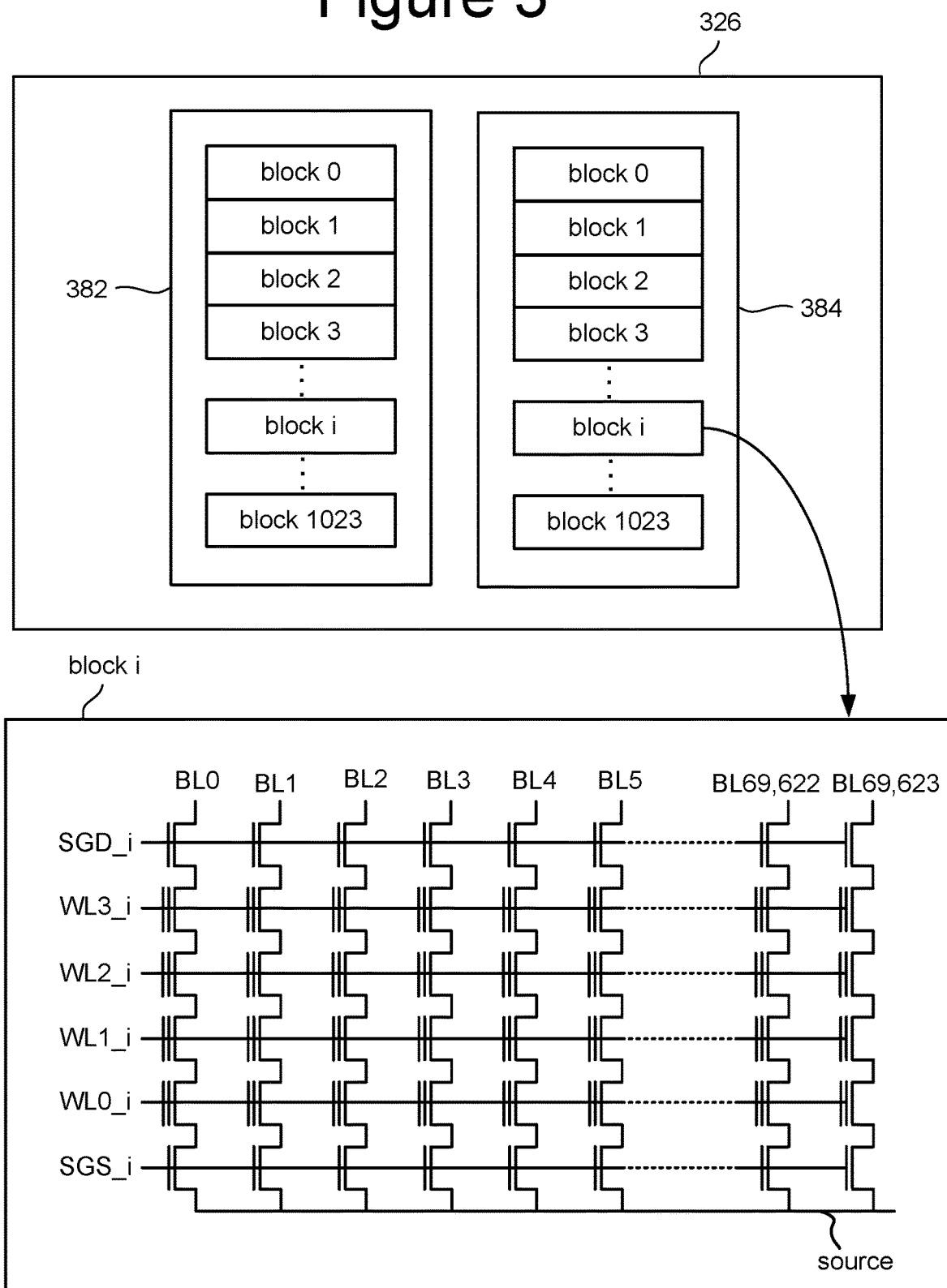
FIG. 3 is a block diagram that depicts details of a non-volatile memory structure.

FIG. 3 depicts an example of memory structure 326. In one embodiment, memory structure 326 is an array of memory cells divided into multiple planes. In FIG. 3, memory structure 326 is divided into two planes: plane 382 and plane 384. In other embodiments, more or fewer than two planes can be used. In some embodiments, each plane is divided into a number of memory erase blocks (e.g., blocks 0-1023, or another amount). In certain memory technologies (e.g. 2D/3D NAND and other types of flash memory), a memory erase block is the smallest unit of memory cells for an erase operation. That is, each erase block contains the minimum number of memory cells that are erased together in a single erase operation. Other units of erase can also be used. In other memory technologies (e.g. MRAM, PCM, etc.) used in other embodiments implementing the solution claimed herein, memory cells may be overwritten without an erase operation and so erase blocks may not exist.

Each memory erase block includes many memory cells. The design, size, and organization of a memory erase block depends on the architecture and design for the memory structure 326. As used herein, a memory erase block is a contiguous set of memory cells that share word lines and bit lines; for example, erase block i of FIG. 3 includes memory cells that share word lines WL0_i, WL1_i, WL2_i and WL3_i and share bit lines BL0-BL69,623.

In one embodiment, a memory erase block (see block i) contains a set of NAND strings which are accessed via bit lines (e.g., bit lines BL0-BL69,623) and word lines (WL0, WL1, WL2, WL3). FIG. 3 shows four memory cells connected in series to form a NAND string. Although four cells are depicted to be included in each NAND string, more or less than four can be used (e.g., 16, 32, 64, 128, 256 or another number or memory cells can be on a NAND string). One terminal of the NAND string is connected to a corresponding bit line via a drain select gate, and another terminal is connected to the source line via a source select gate. Although FIG. 3 shows 69,624 bit lines, a different number of bit lines can also be used.

Each memory erase block and/or each memory unit is typically divided into a number of pages. In one embodiment, a page is a unit of programming and a unit of reading. Other units of programming can also be used. One or more pages of data are typically stored in one row of memory cells. For example, one or more pages of data may be stored in memory cells connected to a common word line. A page includes user data and overhead data (also called system data). Overhead data typically includes header information and Error Correction Codes (ECC) that have been calculated from the user data of the page. The controller (or other component) calculates the ECC when data is being written into the array, and also checks it when data is being read from the array. In one embodiment, a page includes data stored in all memory cells connected to a common word line.

In the example discussed above, the unit of erase is a memory erase block and the unit of programming and reading is a page. Other units of operation can also be used. Data can be stored/written/programmed, read or erased a byte at a time, 1K bytes, 512K bytes, etc. No particular unit of operation is required for the claimed solutions described herein. In some examples, the system programs, erases, and reads at the same unit of operation. In other embodiments, the system programs, erases, and reads at different units of operation. In some examples, the system programs/writes and erases, while in other examples the system only needs to program/write, without the need to erase, because the system can program/write zeros and ones (or other data values) and can thus overwrite previously stored information.

Figure 4A:
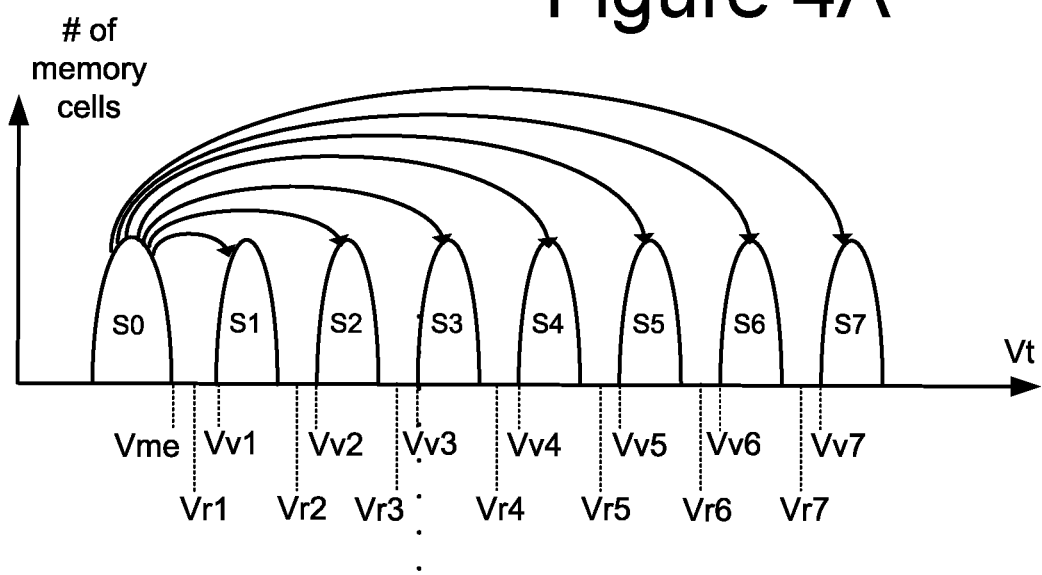
FIG. 4A is a graph of number of memory cells versus threshold voltage.

The memory systems discussed herein can be erased, programmed and read. At the end of a successful programming process (with verification), the threshold voltages of the memory cells should be within one or more distributions (ranges) of threshold voltages for programmed memory cells or within a distribution (range) of threshold voltages for erased memory cells, as appropriate. FIG. 4A illustrates example threshold voltage distributions (ranges) for MLC memory cells that store three bits of data. Other embodiments, however, may use other data capacities per memory cell (e.g., such as one, two, four, or five bits of data per memory cell). FIG. 4A shows eight threshold voltage distributions, corresponding to eight data states. The first threshold voltage distribution (data state) S0 represents memory cells that are erased. The other seven threshold voltage distributions (data states) S1-S7 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring data state, only one bit will be affected.

FIG. 4A also shows seven read reference voltages (also referred to as read compare voltages) Vr1, Vr2, Vr3, Vr4, Vr5, Vr6, andVr7, for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 4A also shows seven verify reference voltages (also referred to as program verify targets) Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 4A represent the full sequence programming. The technology described herein can also be used with other types of programming in addition to full sequence programming (including, but not limited to, multiple stage/phase programming). In some embodiments, data states S1-S7 can overlap, with controller 102 relying on an ECC algorithm to identify the correct data being stored.

Figure 4B:
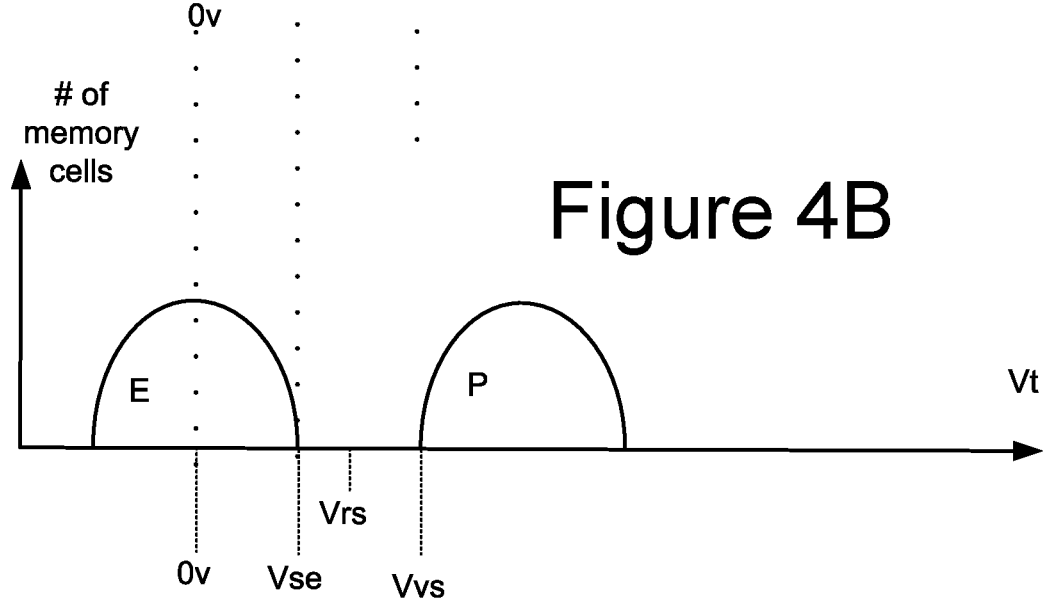
FIG. 4B is a graph of number of memory cells versus threshold voltage.

FIG. 4B illustrates example threshold voltage distributions (ranges) for SLC memory cells. As discussed above, SLC memory cells can be erased or programmed. When erased, the SLC memory cells have threshold voltages in the erased threshold voltage distribution (range) E. When programmed, the SLC memory cells have threshold voltages in the programmed threshold voltage distribution (range) P.

FIG. 4B also shows a read reference voltage (also referred to as read compare voltage) Vrs, a verify reference voltage (also referred to as program verify target) Vvs and an erase verify target Vse. When programming from E to P, the system raises the threshold voltages of the memory cells until they reach at least Vvs. When erasing from P to E, the system lowers the threshold voltages of the memory cells until they reach at least Vse. To read a memory cell storing SLC data, the systems test whether the threshold voltage of the memory cells is less than or greater than Vrs.

Example voltages for FIG. 4A are Vr1=0 v, Vr2=1 v, Vr3=2 v, Vr4=3 v, Vr5=4 v, Vr6=5 v, Vr7=6 v, Vv1=0.4 v, Vv2=1.4 v, Vv3=2.4 v, Vv4=3.4 v, Vv5=4.4 v, and Vv6=5.4 v, Vv7=6.4 v. Example voltages for FIG. 4B are Vse=Vr2=1 v, Vvs=Vv3=2.4 v and Vrs=1.2 v. Thus, the threshold voltage distribution S0 for the erased data state for MLC (in this example embodiment) is completely below 0 volts (see FIG. 4A). On the other hand, the threshold voltage distribution E for the erased data state for SLC depicted in FIG. 4B (in this example embodiment) is partly below 0 volts and partly above zero volts. The lower boundary (corresponding to Vvs) of the threshold voltage distribution P of the SLC programmed data state is the same voltage as Vv3.

Figure 4C:
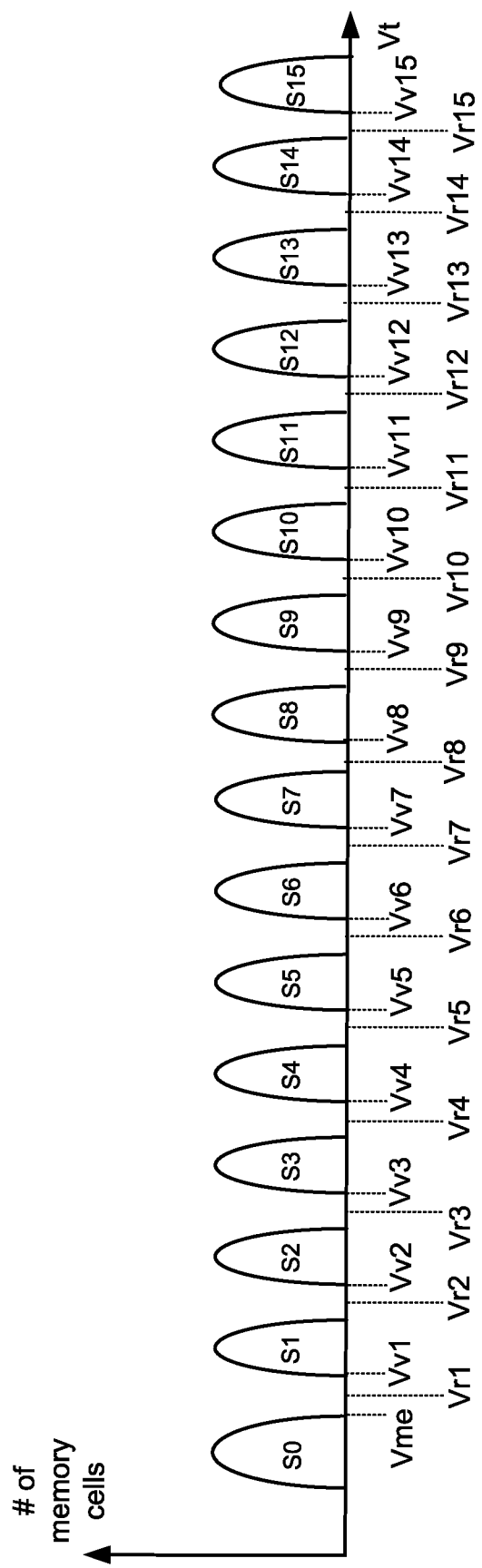
FIG. 4C illustrates example threshold voltage distributions (ranges) for MLC memory cells that store four bits of data.

FIG. 4C illustrates example threshold voltage distributions (ranges) for MLC memory cells that store four bits of data. FIG. 4C shows sixteen threshold voltage distributions, corresponding to sixteen data states. The first threshold voltage distribution (data state) S0 represents memory cells that are erased. The other fifteen threshold voltage distributions (data states) S1-S15 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring data state, only one bit will be affected.

FIG. 4C also shows fifteen read reference voltages (also referred to as read compare voltages) Vr1, Vr2, Vr3, Vr4, Vr5, Vr6, Vr7, Vr8, Vr9, Vr10, Vr11, Vr12, Vr13, Vr14, and Vr15, for reading data from memory cells. By testing (e.g., performing sense operations) whether the threshold voltage of a given memory cell is above or below the seven read reference voltages, the system can determine what data state (i.e., S1, S2, S3, S4, . . . ) a memory cell is in. Note that the read reference voltages Vr1, Vr2, Vr3, Vr4, Vr5, Vr6, Vr7 may be different voltage levels that for the three bit per cell example of FIG. 4A.

FIG. 4C also shows fifteen verify reference voltages (also referred to as program verify targets) Vv1, Vv2, Vv3, Vv4, Vv5, Vv6, Vv7, Vv8, Vv9, Vv10, Vv11, Vv12, Vv13, Vv14, and Vv15. When programming memory cells to data state S1, the system will test whether those memory cells have a threshold voltage greater than or equal to Vv1. When programming memory cells to data state S2, the system will test whether the memory cells have threshold voltages greater than or equal to Vv2. Similar procedures are followed for the other programmed states.

In one embodiment, known as full sequence programming, memory cells can be programmed from the erased data state S0 directly to any of the programmed data states S1-S15. For example, a population of memory cells to be programmed may first be erased so that all memory cells in the population are in erased data state S0. Then, a programming process is used to program memory cells directly into data states S1, S2, S3, S4, S5, S6, S7, S8, S9, S10, S11, S12, S13, S14, S15. For example, while some memory cells are being programmed from data state S0 to data state S1, other memory cells are being programmed from data state S0 to data state S2 and/or from data state S0 to data state S3, and so on. The technology described herein can also be used with other types of programming in addition to full sequence programming (including, but not limited to, multiple stage/phase programming). In some embodiments, data states S1-S15 can overlap, with controller 102 relying on an ECC algorithm to identify the correct data being stored. One type of multi-phase programming that is used to program the memory cells to data states S1, S2, S3, S4, S5, S6, S7, S8, S9, S10, S11, S12, S13, S14, S15 is referred to as a coarse-fine program operation.

Figure 5:
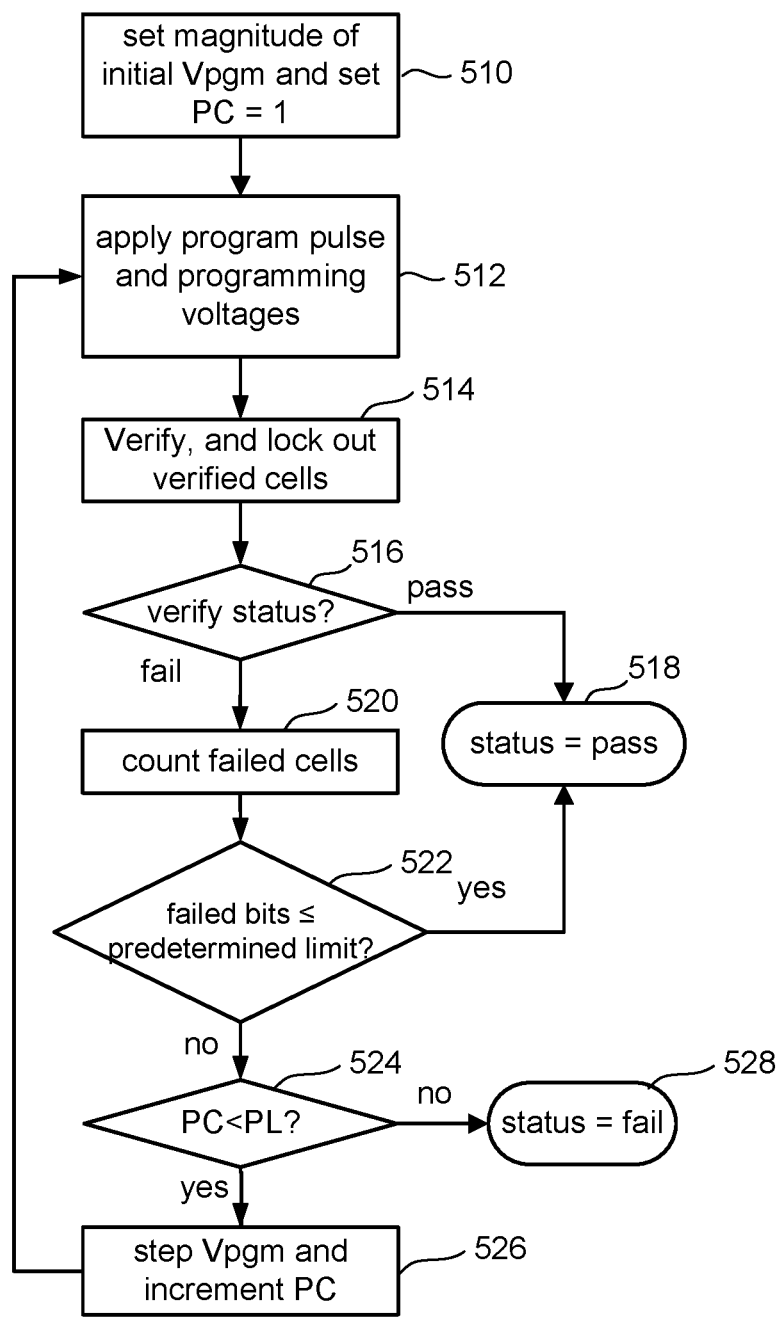
FIG. 5 is a flow chart describing one embodiment of a process for programming.

FIG. 5 is a flowchart describing one embodiment of a process for programming. The process of FIG. 5 is performed by the memory die in response instructions, data and one or more addresses from controller 102. The process of FIG. 5 can also be used to implement the full sequence programming discussed above. The process of FIG. 5 can also be used to implement each phase of a multi-phase programming process. Additionally, the process of FIG. 5 can be used to program memory cells connected to the same word line for SLC or MLC.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 510 of FIG. 5, the programming voltage (Vpgm) is initialized to the starting magnitude (e.g., ~12-16V or another suitable level) and a program counter PC maintained by the state machine is initialized at 1. In step 512, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming. In step 512, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 514, the appropriate memory cells are verified using the appropriate set of verify reference voltages to perform one or more verify operations. In one embodiment, the verification process is performed by applying the testing whether the threshold voltages of the memory cells selected for programming have reached the appropriate verify reference voltage.

In step 516, it is determined whether all the memory cells have reached their target threshold voltages (pass). If so, the programming process is complete and successful because all selected memory cells were programmed and verified to their target data states. A status of "PASS" is reported in step 518. If, in 516, it is determined that not all of the memory cells have reached their target threshold voltages (fail), then the programming process continues to step 520.

In step 520, the system counts the number of memory cells that have not yet reached their respective target threshold voltage distribution. That is, the system counts the number of memory cells that have, so far, failed the verify process. This counting can be done by the state machine, the controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 522, it is determined whether the count from step 520 is less than or equal to a predetermined limit. In one embodiment, the predetermined limit is the number of bits that can be corrected by error correction codes (ECC) during a read process for the page of memory cells. If the number of failed memory cells is less than or equal to the predetermined limit, than the programming process can stop and a status of "PASS" is reported in step 518. In this situation, enough memory cells programmed correctly such that the few remaining memory cells that have not been completely programmed can be corrected using ECC during the read process. In some embodiments, step 520 will count the number of failed cells for each page, each target data state or other unit, and those counts will individually or collectively be compared to a threshold in step 522.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not pre-determined. Instead, it changes based on the number of errors already counted for the page, the number of program-erase cycles performed or other criteria.

If number of failed memory cells is not less than the predetermined limit, then the programming process continues at step 524 and the program counter PC is checked against the program limit value (PL). Examples of program limit values include 12, 20 and 30; however, other values can be used. If the program counter PC is not less than the program limit value PL, then the program process is considered to have failed and a status of FAIL is reported in step 528. This is one example of a program fault. If the program counter PC is less than the program limit value PL, then the process continues at step 526 during which time the Program Counter PC is incremented by 1 and the program voltage Vpgm is stepped up to the next magnitude. For example, the next pulse will have a magnitude greater than the previous pulse by a step size (e.g., a step size of 0.1-0.5 volts). After step 526, the process loops back to step 512 and another program pulse is applied to the selected word line so that another iteration (steps 512-526) of the programming process of FIG. 5 is performed.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 4A) or verify operation (e.g. see verify reference voltages Vv1, Vv2, Vv3, Vv4, Vv5, Vv6, and Vv7 of FIG. 4A) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

In some embodiments, controller 102 receives a request from the host (or a client, user, etc.) to program host data (data received from the host) into the memory system. In some embodiments, controller 102 arranges the host data to be programmed into units of data. For example, controller 102 can arrange the host data into pages, partial pages (a subset of a page), word line units, blocks, jumbo blocks, or other units.

Because it is possible that errors can occur when programming or reading, and errors can occur while storing data (e.g., due to electrons drifting, data retention issues or other phenomenon), error correction is used with the programming of data. Memory systems often use Error Correction Codes (ECC) to protect data from corruption. Many ECC coding schemes are well known in the art. These conventional error correction codes are especially useful in large scale memories, including flash (and other non-volatile) memories, because of the substantial impact on manufacturing yield and device reliability that such coding schemes can provide, rendering devices that have a few non-programmable or defective cells as useable. Of course, a tradeoff exists between the yield savings and the cost of providing additional memory cells to store the code bits (i.e., the code "rate"). As such, some ECC are better suited for flash memory than others. Generally, ECC for flash storage devices tend to have higher code rates (i.e., a lower ratio of code bits to data bits) than the codes used in data communications applications (which may have code rates as low as ½). Examples of well-known ECC commonly used in connection with flash memory include Reed-Solomon codes, other BCH codes, Hamming codes, and the like. Sometimes, the error correction codes used in connection with flash memory are "systematic," in that the data portion of the eventual codeword is unchanged from the actual data being encoded, with the code or parity bits appended to the data bits to form the complete codeword.

The particular parameters for a given error correction code include the type of code, the size of the block of actual data from which the codeword is derived, and the overall length of the codeword after encoding. For example, a typical BCH code applied to a page of 512 bytes (4096 bits) of data can correct up to four error bits, if at least 60 ECC bits are used. Reed-Solomon codes are a subset of BCH codes, and are also commonly used for error correction. For example, a typical Reed-Solomon code can correct up to four errors in a 512 byte page of data, using about 72 ECC bits. In the flash memory context, error correction coding provides substantial improvement in manufacturing yield, as well as in the reliability of the flash memory over time.

In some embodiments, controller 102 receives host data (also referred to as user data or data from an entity external to the storage device), also referred to as information bits, that is to be stored non-volatile memory structure 326. The informational bits are represented by the matrix i=[1 0] (note that two bits are used for example purposes only, and many embodiments have codewords longer than two bits). An error correction coding process (such as any of the processes mentioned above or below) is implemented by ECC engines 226/256 of controller 102 in which parity bits are added to the informational bits to provide data represented by the matrix or codeword v=[1 0 1 0], indicating that two parity bits have been appended to the data bits. Other techniques can be used that map input data to output data in more complex manners. For example, low density parity check (LDPC) codes, also referred to as Gallager codes, can be used. More details about LDPC codes can be found in R. G. Gallager, "Low-density parity-check codes," IRE Trans. Inform. Theory, vol. IT-8, pp. 21 28, January 1962; and D. MacKay, Information Theory, Inference and Learning Algorithms, Cambridge University Press 2003, chapter 47. In practice, such LDPC codes are typically applied (e.g., by ECC engines 226/256) to multiple pages encoded across a number of memory elements, but they do not need to be applied across multiple pages. The data bits can be mapped to a logical page and stored in memory structure 326 by programming one or more memory cells to one or more programming states, which corresponds to v.

Figure 6:
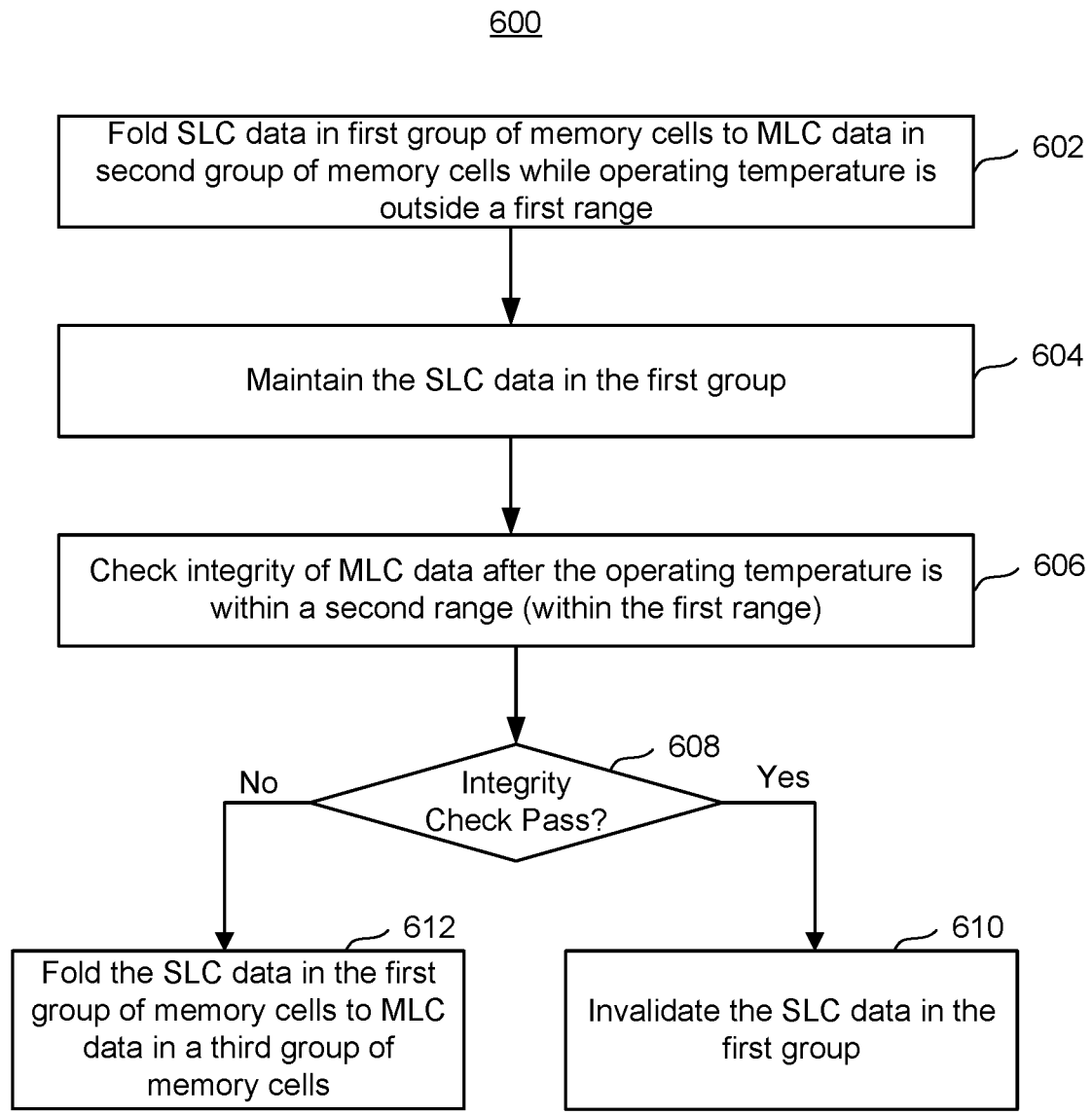
FIG. 6 depicts a flowchart of one embodiment of process of operating non-volatile storage to extend the useful range of operating temperature of the storage device.

FIG. 6 depicts a flowchart of one embodiment of process 600 of operating non-volatile storage. The process 600 may be used to extend the useful range of operating temperature of the storage device. For the sake of example, the storage device might otherwise have a useful range of 70 degrees C. for operating MLC cells. This range might be, for example, 0 to 70 degrees C., 5 to 75 degrees C., 10 to 80 degrees C., etc. Process 600 describes two ranges of operating temperatures. The two ranges could be co-extensive but that is not required. The first range could be, for example, one of the aforementioned 70 degree C. ranges. In this example, process 600 may be used to extend the useful range below and/or above this 70 degree C. range.

Step 602 includes folding SLC data that is stored in a first group of non-volatile memory cells at a single bit per memory cell into MLC data that is stored in a second group of non-volatile memory cells at multiple bits per memory cell. The first group of memory cells may be referred to as SLC cells, and the second group of memory cells may be referred to as MLC cells. The MLC data might be stored at two-, three-, four-, or five-bits per memory cell. The MLC data could be stored at greater than five-bits per memory cell. The folding operating results in copying the SLC data from the SLC cells to MLC data in the MLC cells.

Step 602 is performed while the storage device has an operating temperature outside of the first temperature range. In one embodiment, step 602 is performed when the operating temperature is below the first temperature range, but is not necessarily performed when the operating temperature is above the first temperature range. For example, the first temperature range could be 10 to 80 degrees, with step 602 performed below 10 degrees C., but not necessarily performed above 80 degrees C.

In one embodiment, step 602 is performed when the operating temperature is above the first temperature range, but is not necessarily performed when the operating temperature is below the first temperature range. For example, the first temperature range could be 0 to 70 degrees, with step 602 performed above 70 degrees C., but not necessarily performed below 0 degrees C.

In one embodiment, step 602 is performed both when the operating temperature is below the first temperature range and when the operating temperature is above the first temperature range. For example, the first temperature range could be 5 to 75 degrees, with step 602 performed both below 5 degrees C. and above 75 degrees C.

Although step 602 is performed when the operating temperature is outside of the first range, step 602 is not necessarily performed if the operating temperature is far outside of the first range. For example, process 600 might be used to extend the upper end of the range from 70 degrees to 80 degrees C. As a particular example, if the first temperature range is 10 to 80 degrees C., step 602 might be performed between to −5 to 10 degrees C., but not below −5 degrees C. As another example, if the first temperature range is 0 to 70 degrees C., step 602 might be performed between 70 to 85 degrees C., but not above 85 degrees C.

The amount of data that is folded in step 602 can vary greatly in size. For example, folding can take place for pages, blocks, meta-blocks, etc. A meta-block refers to a logical grouping of physical blocks. The physical blocks in a meta-block could be, but are not required to be, on different memory die 300. A meta-block may also be referred to as a super-block or as a jumbo block. As one example, SLC data that occupies four blocks of SLC cells can be folded to MLC data that occupies one block of MLC cells.

In one embodiment, the folding operation includes performing what is referred to as an on-chip copy. The term "chip" here is referring to a memory die 300. In an on-chip copy the data that is read from the SLC cells is not transferred from memory die 300 to the controller 102 to execute an ECC algorithm to correct any errors in the SLC data prior to programming the data in the MLC cells. Note that the on-chip copy of a folding operation could occur in parallel on different memory die 300. In one embodiment, an on-chip copy is performed under control of the state machine 312. It is not required that the folding operation use an on-chip copy. In one embodiment, the SLC data is transferred from a memory die 300 to the controller 102, wherein error correction may be performed. Then, the controller 102 sends the corrected data to a memory die 300 to be programmed into MLC cells.

Step 604 includes maintaining the SLC data in the SLC cells after the SLC data has been folded to the MLC cells. Maintaining the SLC data in the SLC cells means that the SLC data remains available for access. Thus, the SLC data is not erased while it is maintained. The memory controller 102 may track which SLC cells contain valid data, in which case step 604 may include keeping this indicator that the SLC cells still contain valid data. The SLC data may have been previously stored in the first group in response to a write command from a host. In one embodiment, the host specifies logical addresses in the request to write the SLC data to the non-volatile memory 104. There could be one or more logical addresses, depending on the amount of data. Step 604 may include the controller 102 maintaining a mapping from the one or more logical addresses to the physical location(s) of the first group of memory cells. The mapping could be stored in volatile memory (e.g., DRAM, 106, SRAM 230, 260) or non-volatile memory (e.g., memory structure 326). Further details of one embodiment of mapping tables, which may be used in step 604, are shown and described with respect to FIGS. 10A-10D.

Step 606 includes checking the data integrity of the MLC data in the second group of non-volatile memory cells after the operating temperature is within the second range of temperature. In one embodiment, step 606 includes the controller 102 determining a bit error rate (BER) for at least a portion of the MLC data. The controller 102 may use the ECC engine 226/256 to determine the BER. For example, the BER of each page of MLC data may be determined. Further details of one embodiment of checking the data integrity of the MLC data are discussed in connection with FIG. 12.

As noted above, the second temperature range is within the first temperature range if the second temperature range does not contain a temperature that is not in the first temperature range. The second temperature range could be co-extensive with the first temperature range. In one embodiment, if the folding was done below the first temperature range, then step 606 is performed after the operating temperature raises to the lower end of the second temperature range. In one embodiment, if the folding was done above the first temperature range, then step 606 is performed after the operating temperature falls to the upper end of the second temperature range. In one embodiment, the second temperature range is limited to what may be referred to as a normal operating temperature range. An example of a normal operating temperature range is 30 to 50 degrees C. The lower end of the second temperature range could be higher or lower than 30 degrees C. The upper end of the second temperature range could be higher or lower than 50 degrees C. The second temperature range could be a single temperature, such as 25 degrees C.

Step 608 is a determination of whether a data integrity check passed. In one embodiment, the memory controller 102 determines whether the MLC data is within an error tolerance. The error tolerance is defined in terms of the ability of the storage device 100 to correct any errors in the MLC data. For example, the storage device may use ECC engine 226/256 to correct any errors in the MLC data. The error tolerance could be lower than the maximum number of errors that the storage device is able to correct. In one embodiment, the error tolerance is defined in terms of a BER, but other techniques can be used to define the error tolerance. In one embodiment, the data integrity check passes if the BER of each page is less than a specified BER. Further details of one embodiment of a data integrity check are discussed below in connection with the flowchart depicted in FIG. 12.

Control passes to step 610 if the data integrity check passes. Step 610 includes invalidating the SLC data in the first group of non-volatile memory cells. In one embodiment, invalidating the SLC data includes the controller 102 storing an indication that the SLC data in the first group is no longer valid. This indication could be stored in one of the tables that is used to translate from logical to physical addresses. Step 610 may include the controller 102 updating one or more tables that translate from logical addresses to physical addresses to reflect the fact that the SLC data in the first group is no longer valid. In one embodiment, invalidating the SLC data in the first group includes erasing the SLC data in the first group. In one embodiment, the erase is under control of the state machine 312 in response to a command from the controller 102.

Control passes to step 612 if the data integrity check fails. Step 612 includes folding the SLC data in the first group of non-volatile memory cells into MLC data in a third group of non-volatile memory cells in the storage device. In one embodiment, step 612 also includes invalidating the MLC data, which may include the controller 102 storing an indication that the MLC data in the second group is no longer valid. Step 612 may include the controller 102 updating one or more tables that translate from logical addresses to physical addresses to reflect the fact that the MLC data in the second group is no longer valid. In one embodiment, invalidating the MLC data in the second group includes erasing the MLC data in the second group. In one embodiment, the erase is under control of the state machine 312 in response to a command from the controller 102.

Figure 7:
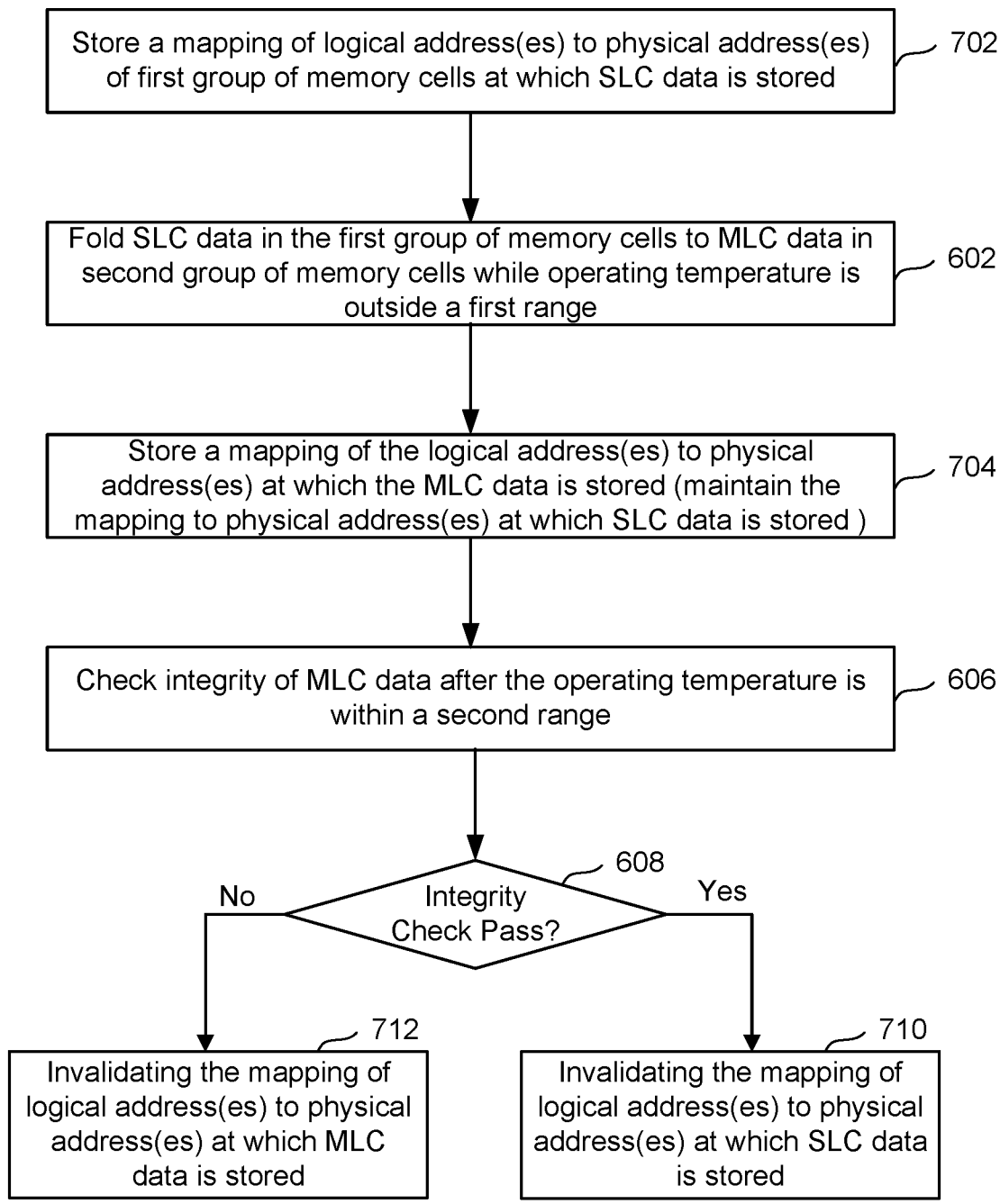
FIG. 7 depicts a flowchart of one embodiment of a process of operating non-volatile storage to extend the useful range of operating temperature of the storage device.

FIG. 7 depicts a flowchart of one embodiment of a process 700 of operating non-volatile storage. The process 700 may be used to extend the useful range of operating temperature of the storage device 100. In one embodiment, process 700 provides further details for process 600. For example, process 700 may execute some of the steps discussed in process 600 (e.g., steps 602, 606, 608). However, process 700 is not required to perform every step of process 600. For example, process 700 may perform steps 710 and 712 as alternatives to steps 610 and 612, respectively.

Step 702 includes the controller 102 storing a mapping of one or more logical addresses to one or more physical addresses of a first group of non-volatile memory cells at which SLC data is stored at one bit per memory cell. The mapping could be stored in volatile memory (e.g., DRAM, 106, SRAM 230, 260) or non-volatile memory (e.g., memory structure 326). Further details of one embodiment of mapping tables, which may be used in step 702, are shown and described with respect to FIGS. 10A-10D.

Step 602 includes folding the SLC data that is stored in the first group of non-volatile memory cells into MLC data that is stored in a second group of non-volatile memory cells that is stored at multiple bits per memory cell. Step 602 is performed while the storage device has an operating temperature outside of the first temperature range. The MLC data might be stored at two-, three-, four-, or five-bits per memory cell. The MLC data could be stored at greater than five-bits per memory cell. The folding operating results in copying the SLC data from the SLC cells to MLC data in the MLC cells.

Step 704 includes the controller 102 storing a mapping of the one or more logical addresses to one or more physical addresses of the second group of non-volatile memory cells at which the MLC data is stored. The mapping could be stored in volatile memory (e.g., DRAM, 106, SRAM 230, 260) or non-volatile memory (e.g., memory structure 326). Further details of one embodiment of mapping tables, which may be used in step 704, are shown and described with respect to FIGS. 10A-10D.

Step 606 includes checking the data integrity of the MLC data in the second group of non-volatile memory cells after the operating temperature is within the second range of temperature. In one embodiment, step 606 includes the controller 102 determining a bit error rate (BER) for at least a portion of the MLC data. For example, the BER of each page of MLC data may be determined.

Step 608 is a determination of whether a data integrity check passed. In one embodiment, the data integrity check passes if the BER of each page is less than a specified BER. Further details of one embodiment of checking the data integrity of the MLC data are discussed in connection with FIG. 12.

Control passes to step 710 if the data integrity check passes. Step 710 includes invalidating the mapping of the logical address(es) to the physical address(es) of the first group of non-volatile memory cells that store the SLC data. In one embodiment, invalidating the mapping includes the controller 102 storing an indication that the mapping to the first group is no longer valid. Step 710 may include updating one or more tables that translate from logical addresses to physical addresses to reflect the fact that the mapping to the first group is no longer valid.

Control passes to step 712 if the data integrity check fails. Step 712 includes invalidating the mapping of the logical address(es) to the physical address(es) of the second group of non-volatile memory cells that store the MLC data. In one embodiment, invalidating the mapping includes the controller 102 storing an indication that the mapping to the second group is no longer valid. Step 712 may include the controller 102 updating one or more tables that translate from logical addresses to physical addresses to reflect the fact that the mapping to the second group is no longer valid. Other actions may also be taken responsive to the data integrity check failing. In one embodiment, the SLC data in the first group of non-volatile memory cells is folded into MLC data in a third group of non-volatile memory cells in the storage device.

Figure 8:
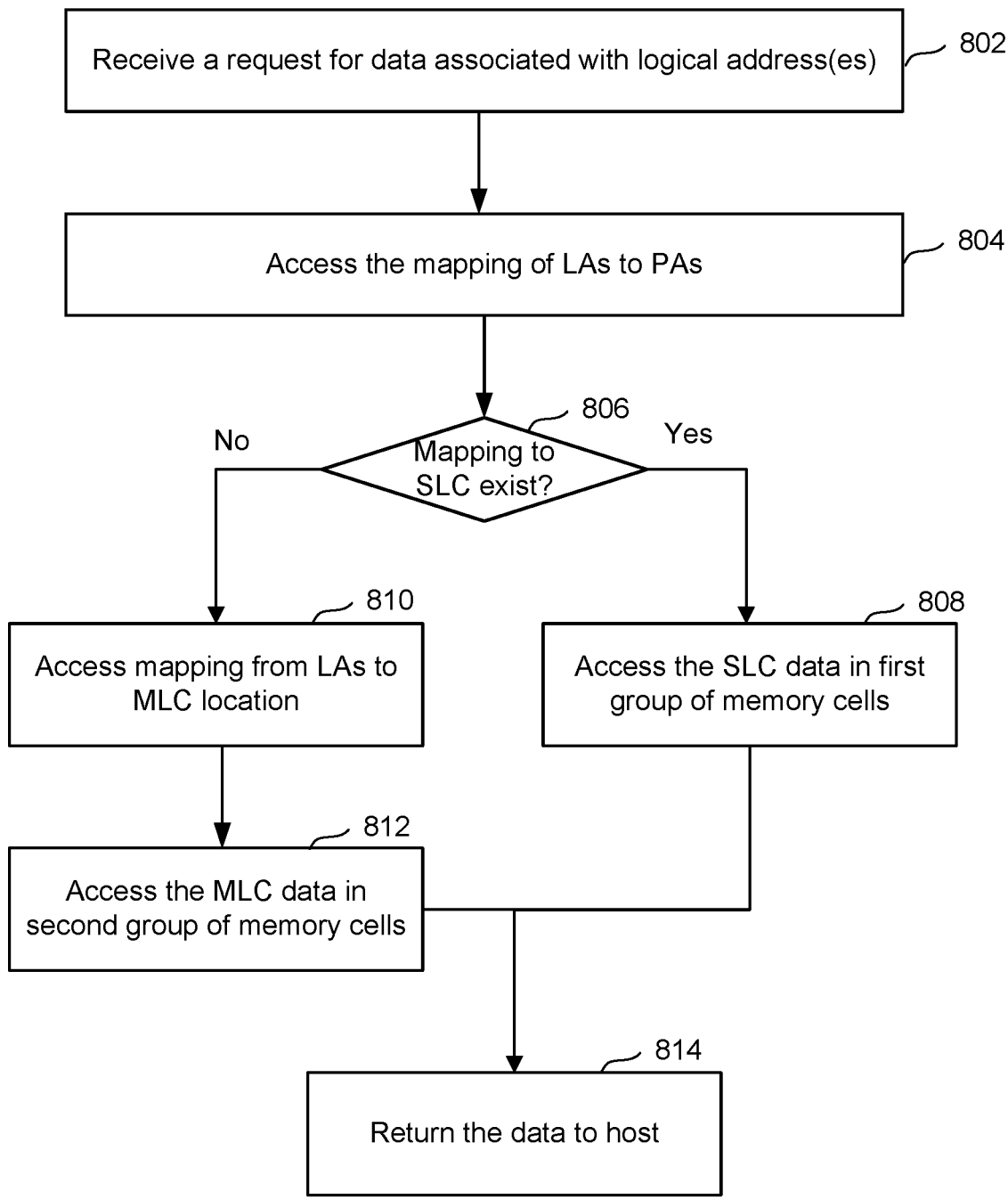
FIG. 8 depicts a flowchart of one embodiment of process of returning data to a host.

FIG. 8 depicts a flowchart of one embodiment of process 800 of returning data to a host. The process 800 may be used in combination with process 600 and/or 700, but is not limited thereto. Process 800 allows the storage device to make a decision as to whether to access SLC data or MLC data to respond to a host request for data. Process 800 may allow the storage device to access the SLC data prior to the MLC data passes a data integrity check.

Step 802 includes the controller 102 receiving a request from the host 120 for data associated with one or more logical addresses. In one embodiment, the host 120 specifies one or more logical addresses in a read request. By the data being associated with one or more logical addresses it is meant that the host 120 previously requested that the storage device store that data while specifying the one or more logical addresses.

Step 804 includes the controller 102 accessing a mapping of logical addresses to physical addresses. In one embodiment, this mapping includes a mapping from logical addresses to virtual addresses, as well as a mapping from virtual addresses to physical addresses.

Step 806 includes a determination of whether a valid mapping to SLC data in SLC memory cells exists. If such a valid mapping exists, then control passes to step 808. Step 808 includes accessing the SLC data in the first group of memory cells. In one embodiment, the controller 102 sends a command (or commands) to one or more memory die 300 for the data. The data is read from the SLC cells under control of the state machine 312, and returned to the controller 102. The controller 102 may use the ECC engine 226/256 to correct any errors in the data. Step 814 includes returning the data to the host in order to satisfy the request from the host 120.

If a valid mapping to SLC data in SLC memory cells does not exist, then control passes to step 810. Step 810 includes the controller 102 accessing a mapping from the logical address(es) in the request to physical address(es) of MLC cells that store MLC data. The MLC cells will be referred to as a second group of memory cells. Step 812 includes accessing the MLC data in the second group of memory cells. In one embodiment, the controller 102 sends a command (or commands) to one or more memory die 300 for the data. The data is read from the MLC cells under control of the state machine 312, and returned to the controller 102. The controller 102 may use the ECC engine 226/256 to correct any errors in the data. Step 814 includes returning the data to the host 120 in order to satisfy the request from the host.

Figure 9:
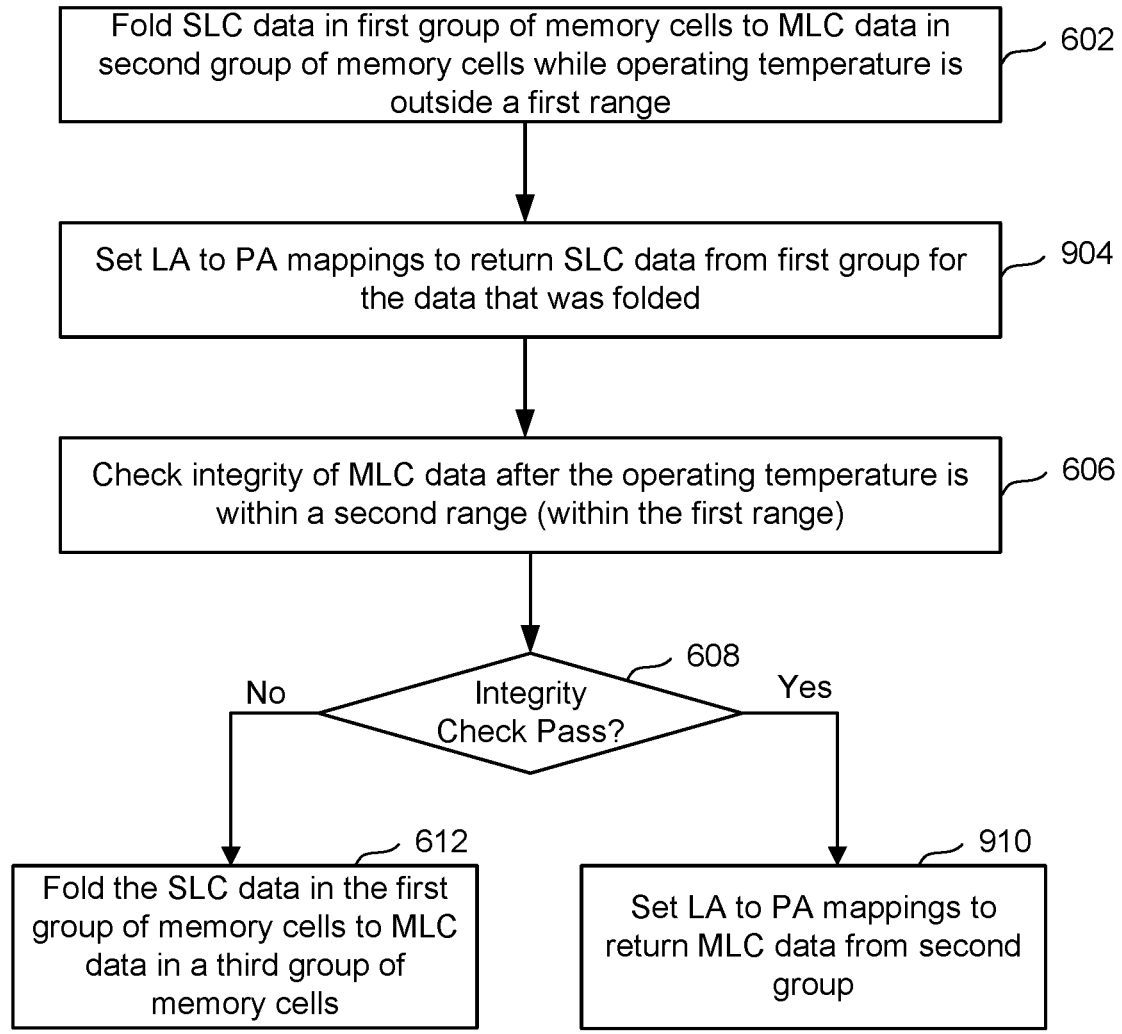
FIG. 9 depicts a flowchart of one embodiment of a process of operating non-volatile storage to extend the useful range of operating temperature of the storage device.

FIG. 9 depicts a flowchart of one embodiment of a process 900 of operating non-volatile storage. The process 900 may be used to extend the useful range of operating temperature of the storage device. In one embodiment, process 900 provides further details for process 600. For example process 900 may execute some of the steps discussed in process 600 (e.g., steps 602, 606, 608, 612). However, process 900 is not required to perform every step of process 600. For example, process 900 may perform steps 910 as an alternative to step 610.

Step 602 includes folding the SLC data that is stored in the first group of non-volatile memory cells into MLC data that is stored in a second group of non-volatile memory cells that is stored at multiple bits per memory cell. Step 602 is performed while the storage device has an operating temperature outside of the first temperature range. The MLC data might be stored at two-, three-, four-, or five-bits per memory cell. The MLC data could be stored at greater than five-bits per memory cell. The folding operating results in copying the SLC data from the SLC cells to MLC data in the MLC cells.

Step 904 includes setting logical address to physical address mappings to return SLC data from the first group of memory cells in response to a host request for the data that was folded. Thus, note that although the storage device could obtain the data from either the SLC cells or from the MLC cells, the data that was folded will be returned from the SLC cells. The logical address to physical address mappings may include a first mapping from logical addresses to virtual addresses, and a second mapping from the virtual addresses to physical addresses. In this case, step 904 may include changing the first and/or the second mapping. Step 904 may be performed by the controller 102. Examples of the logical address to physical address mappings are shown and described with respect to FIGS. 10A-10D, which are to be discussed below.

Step 606 includes checking the data integrity of the MLC data in the second group of non-volatile memory cells after the operating temperature is within the second range of temperature. In one embodiment, step 606 includes determining a bit error rate (BER) for at least a portion of the MLC data. For example, the BER of each page of MLC data may be determined.

Step 608 is a determination of whether a data integrity check passed. In one embodiment, the data integrity check passes if the BER of each page is less than a specified BER. Further details of one embodiment of checking the data integrity of the MLC data are discussed in connection with FIG. 12.

Control passes to step 910 if the data integrity check passes. Step 910 includes changing the mapping that was established in step 904. The change will allow the storage device to now return the data from the MLC cells in response to a host request for the data that was folded. Step 910 includes setting the logical address to physical address mappings to return the MLC data from the second group of memory cells in response to a host request for the data that was folded. As noted, the logical address to physical address mappings may include a first mapping from logical addresses to virtual addresses, and a second mapping from the virtual addresses to physical addresses. In this case, step 910 may include changing the first and/or the second mapping. Step 910 may be performed by the controller 102.

Control passes to step 612 if the data integrity check passes. Step 612 includes folding the SLC data in the first group of non-volatile memory cells into MLC data in a third group of non-volatile memory cells in the storage device.

FIGS. 10A, 10B 10C, and 10D depict various tables that may be used to map between addresses. Tables 1010 and 1020 may be stored in volatile memory (e.g., DRAM, 106, SRAM 230, 260) and/or non-volatile memory (e.g., memory structure 326). In one embodiment, a portion of the tables 1010 and 1020 may be cached in, for example, SRAM 230, 260. Tables 1010 and 1020 may be maintained by the controller 102.

Figure 10A:
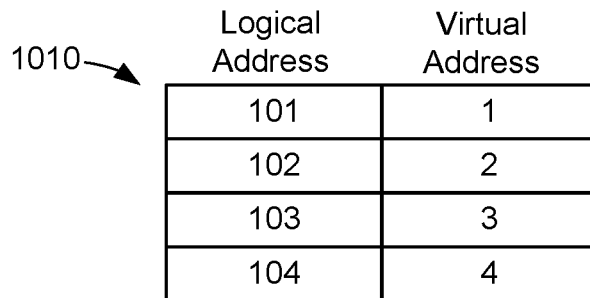
FIGS. 10A, 10B 10C, and 10D depict various tables that may be used to map between addresses.

FIG. 10A shows a table 1010 that maps between logical addresses and virtual addresses. Table 1010 may referred to as an LA (logical address) to VA (virtual address) table. Only four addresses of each type are depicted in order to illustrate a simple example that will be discussed below in connection with FIG. 11.

Figure 10B:
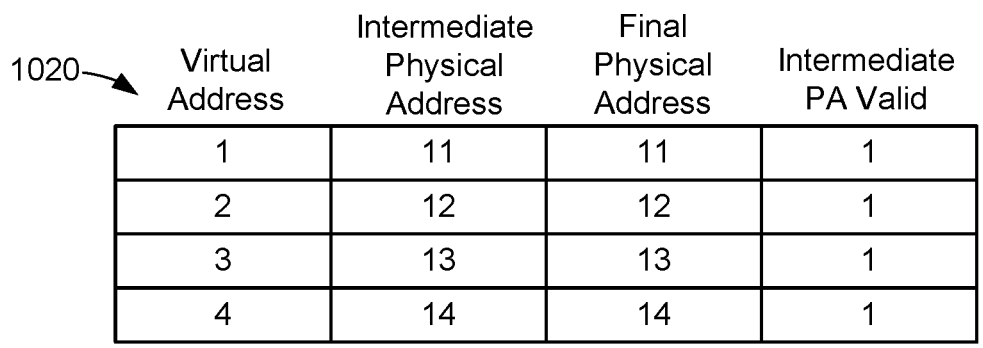
Figure 10C:
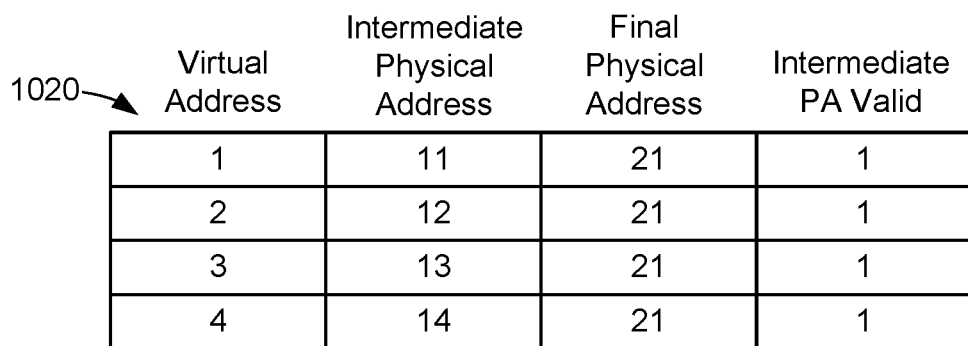
Figure 10D:
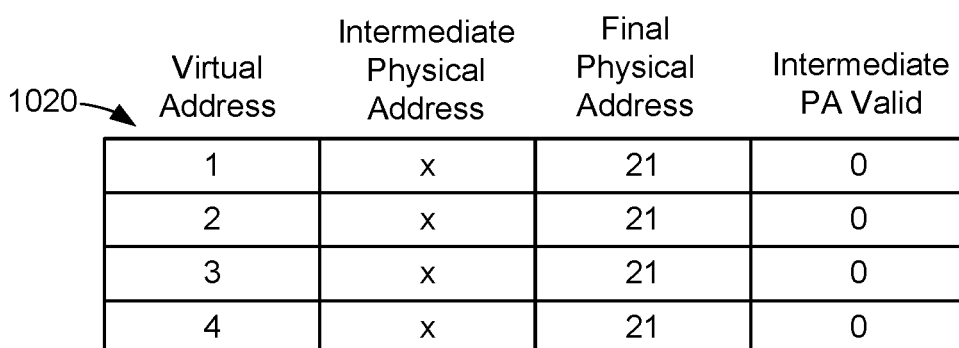

FIG. 10B shows a table 1020 that maps between virtual addresses and physical addresses. Each virtual address is mapped to at least one physical address in the table 1020. In the example in table 1020 each virtual address is mapped to one intermediate physical address, as well as to one final physical address. The table 1020 contains a flag field (labeled "Intermediate PA Valid") that is used to indicate whether the intermediate physical address is valid. FIGS. 10C and 10D also depict table 1020, but at different times from the example of FIG. 10B. FIGS. 10B-10D will be discussed in more detail in connection with FIG. 11. Table 1020 may be referred to as a VA (virtual address) to PA (physical address) table.

The physical addresses in table 1020 may include physical identifiers that identify physical or structural components of a memory package 104 where the data associated with the physical address is stored. Example physical identifiers may include, but are not limited to, a chip (or die) identification number, a plane identification number, and/or a block identification number, a word line identification number. Note that the physical addresses in table 1020 may be simplified for purpose of illustration. In one embodiment, the physical addresses depicted in table 1020 are block identification numbers. In one embodiment, the virtual addresses depicted in tables 1010, 1020 are meta-block identification numbers.

Figure 11:
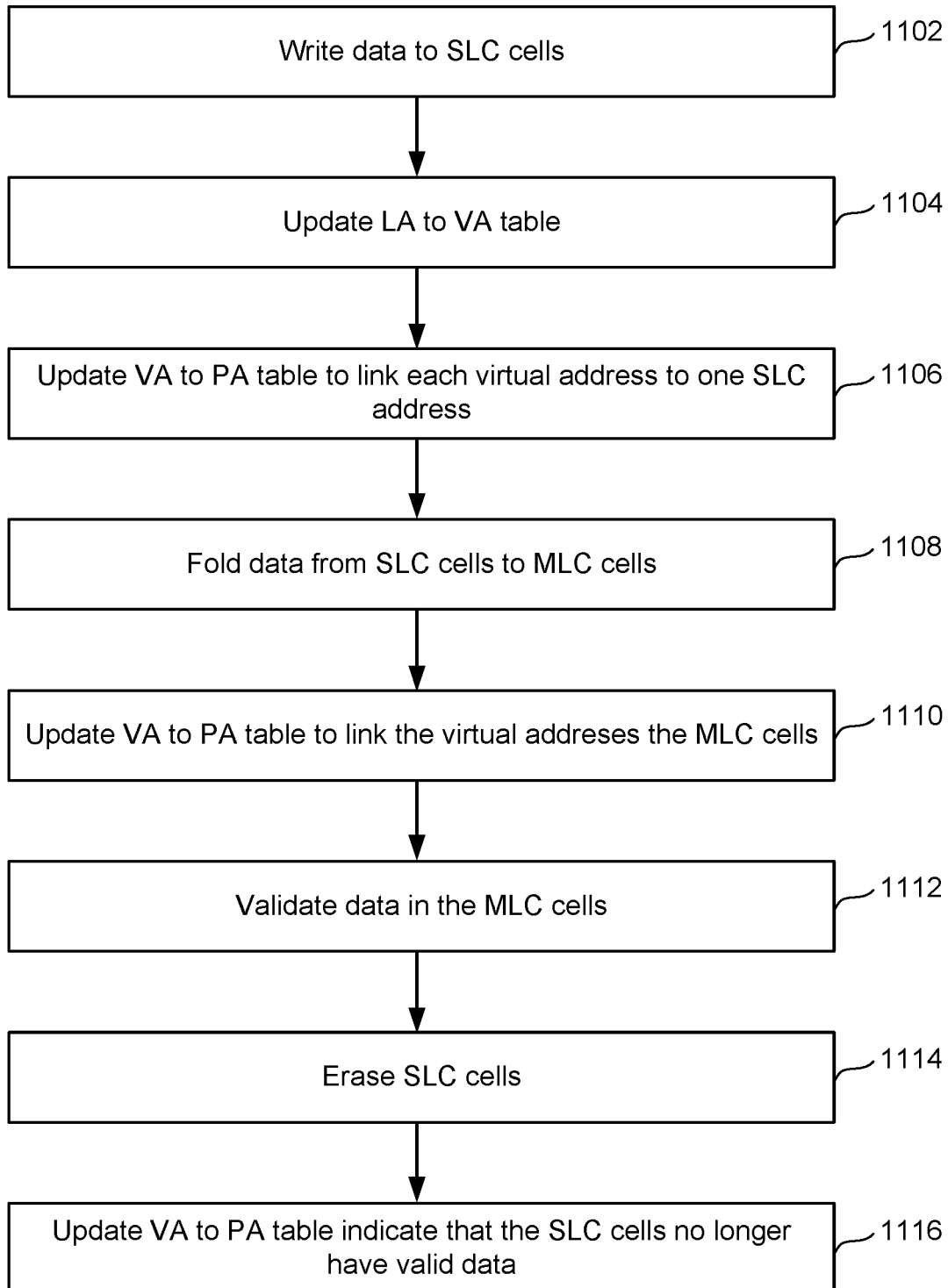
FIG. 11 depicts one embodiment of a process of updating mapping tables.

FIG. 11 depicts one embodiment of a process 1100 of updating mapping tables. The process 1100 may be used in combination with any of process 600, 700, 800 and/or 900. In particular, the process 1100 may be used to help manage how logical addresses are mapped to SLC data in SLC memory cells, as well as to MLC data in MLC data cells. The process 1100 may also be used to help manage whether the SLC data or the MLC data is returned to a host in response to a read request.

Step 1102 includes writing data to SLC memory cells. Step 1102 may be performed in response to a request from host 120 to write data associated with one or more logical addresses. In one embodiment, the controller 102 receives the request from the host 120 and sends the data to a memory package 104. The data may be writing data to the SLC memory cells under direction of state machine 312.

Step 1104 includes updating the LA to VA table 1010. With reference to FIG. 10A, the LA to VA table 1010 is updated by the controller 102 to map logical addresses 101-104 to virtual addresses 1-4, respectively. In one embodiment, each virtual address is associated with what is referred to as a meta-block (which may also be referred to as a jumbo block). However, a virtual address could be associated with some other unit, such as a block, a page, etc.

Step 1106 includes the controller 102 updating the VA to PA table 1020 to link each virtual address with a physical address of SLC cells. With reference to FIG. 10B, the physical addresses of the SLC cells are 11, 12, 13, and 14. This could be four meta-blocks of SLC cells, four blocks of SLC cells, four pages of SLC cells, etc. Both the intermediate physical addresses and the final physical addresses are updated, in this example. Also, a flag is set to indicate that the intermediate physical address is valid.

Step 1108 includes folding the SLC data from the SLC cells to MLC cells. In one step 1108 includes performing step 602 from any of process 600, 700, or 900.

Step 1110 includes the controller 102 updating the VA to PA table 1020 to link the virtual addresses to the MLC cells. With reference to FIG. 10C, the final physical addresses are modified to point to the physical addresses of the MLC cells. In this example, the physical address of the MLC cells is 21. This could be a meta-block of MLC cells, a block of MLC cells, a word line that stores four pages of MLC data, etc. The intermediate physical addresses remain pointing to the SLC cells. The flag that indicates that the intermediate physical addresses is valid remains set.

Step 1112 includes the controller 102 validating the MLC data in the MLC cells. In one embodiment, step 1112 includes checking the data integrity of the MLC data when the operating temperature is in the second range (e.g., step 606). For the sake of discussion, the data integrity check passes.

Step 1114 includes erasing the SLC cells. In one embodiment, the erase is under control of the state machine 312 in response to a command from the controller 102. The erased SLC cells may then be returned to a pool of free SLC cells. For example, the memory controller 102 may keep track of which SLC blocks are erased, and thus available for programming.

Step 1116 includes the controller 102 updating the VA to PA table 1020 to indicate that that SLC cells no longer store valid data. With reference to FIG. 10D, table 1020 is updated to set the flag to 0 to indicate that the intermediate physical address is no longer valid. The address in the intermediate physical address field may be deleted.

Figure 12:
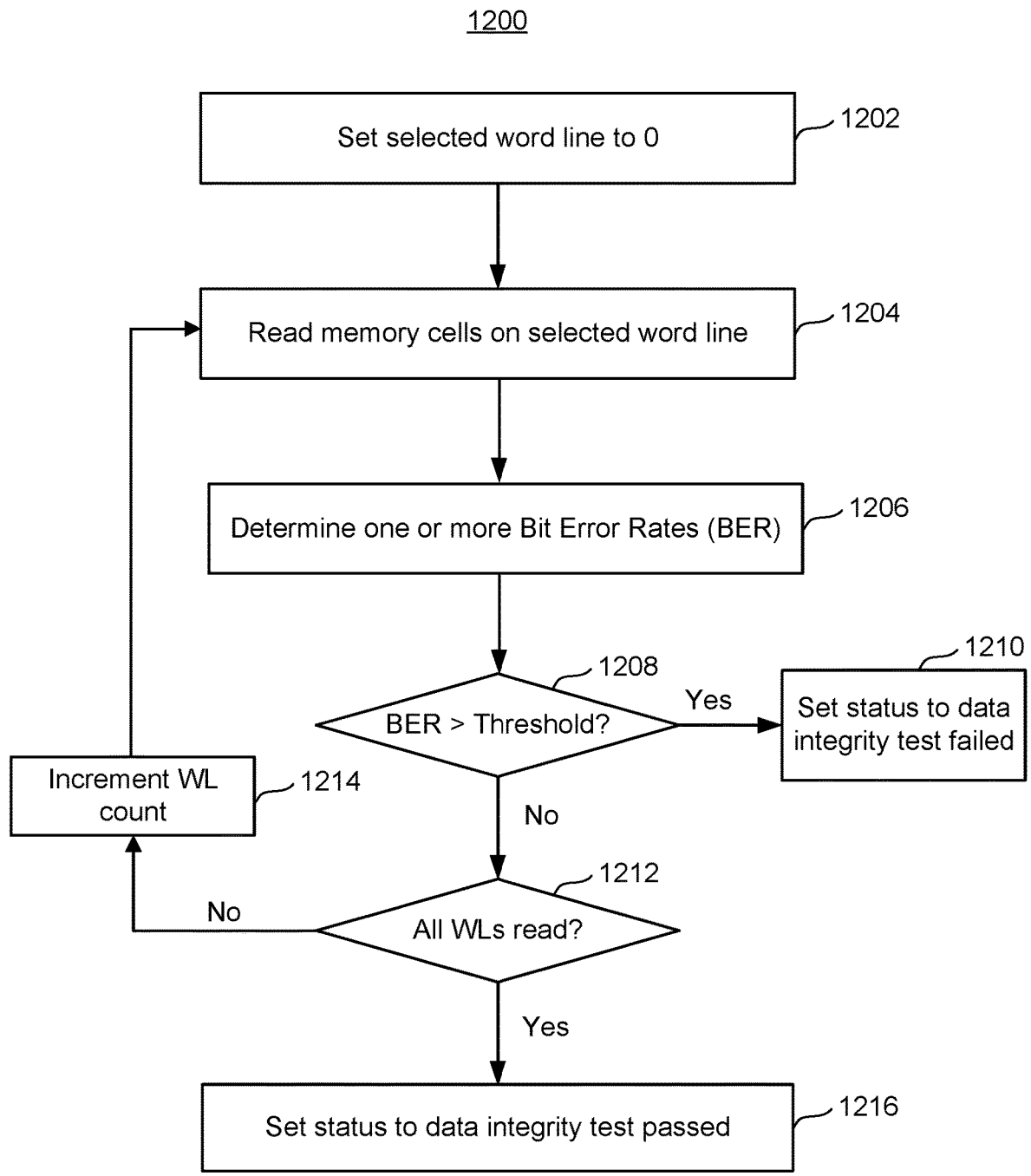
FIG. 12 depicts a flowchart of one embodiment of a process of performing a data integrity check.

FIG. 12 depicts a flowchart of one embodiment of a process 1200 of performing a data integrity check. Process 1200 may be used in steps 606-608 in any of process 600, 700, and/or 900. Process 1200 is one embodiment of determining whether the MLC data is within an error tolerance. Process 1200 describes one embodiment of performing a data integrity check for a block of MLC cells (or an "MLC block"). The data integrity check could be performed on a unit other than an MLC block. The MLC block contains a number of word lines, which are read one at a time in process 1200. The word line that is presently being read is referred to as the selected word line. In process 1200, the word lines are read from a low numbered word line to a highest number word line, but the order can be varied.

Step 1202 includes setting the selected word line to 0. Step 1204 includes reading memory cells on the selected word line. In one embodiment, the memory cells on the selected word line store one page for each bit stored per memory cell. For example, if four bits are stored per memory cell, then four pages are read.

Step 1206 includes determining one or more bit error rates (BER). In one embodiment, a BER is determined for each page that was read in step 1202. In one embodiment, step 1206 includes the controller 102 using the ECC engine 226/256 to decode the data that was read from the MLC cells. The ECC engine 226/256 may be used to correct any errors in the data. Thus, a BER may be determined from a comparison with the raw (uncorrected) data and the corrected data. In one embodiment, a BER is determined for each page of data. If more than one BERs are determined, the highest BER may be used as representative for the selected word line. It is possible that the ECC engine 226/256 is unable to correct all of the errors, in which the BER may be set to a value that indicates this uncorrectable situation. While it is possible to use further efforts to read the data, such recovery efforts are not requires as a copy of the data is still maintained in the SCL cells.

Step 1208 includes a determination of whether the BER is greater than a threshold. If more than one BER were determined in step 1206, then the highest BER may be compared to the threshold. In one embodiment, the threshold will be no higher than the number of bits that can be corrected by the ECC engine 226/256. The threshold may be lower than the number of bits that can be corrected by the ECC engine 226/256. If the BER is greater than the threshold, then in step 1210 the status is set to indicate that the data integrity step failed. In one embodiment, step 1208 is performed by controller 102.

If the BER is not greater than the threshold, then control passes to step 1212. Step 1212 includes a determination of whether all word lines in the MLC block have been read. If not, then the word line count is incremented in step 1214. Then, control passes to step 1204 to read the next selected word line. If the BER is greater than the threshold for this word line, then the process concludes in step 1210 with a status of failure. In one embodiment of process 1200, all of the word lines in the block are read. However, optionally a subset of fewer than all word lines could be read. For example, only the word lines that are expected to have the highest BERs may be read. After all the word lines that are to be read have been read (step 1212=yes), control passes to step 1216. Note that control only passes to step 1216 if all word line that have been read pass the BER test if step 1208. In step 1216, the status of the data integrity step is set to pass.

Figure 13:
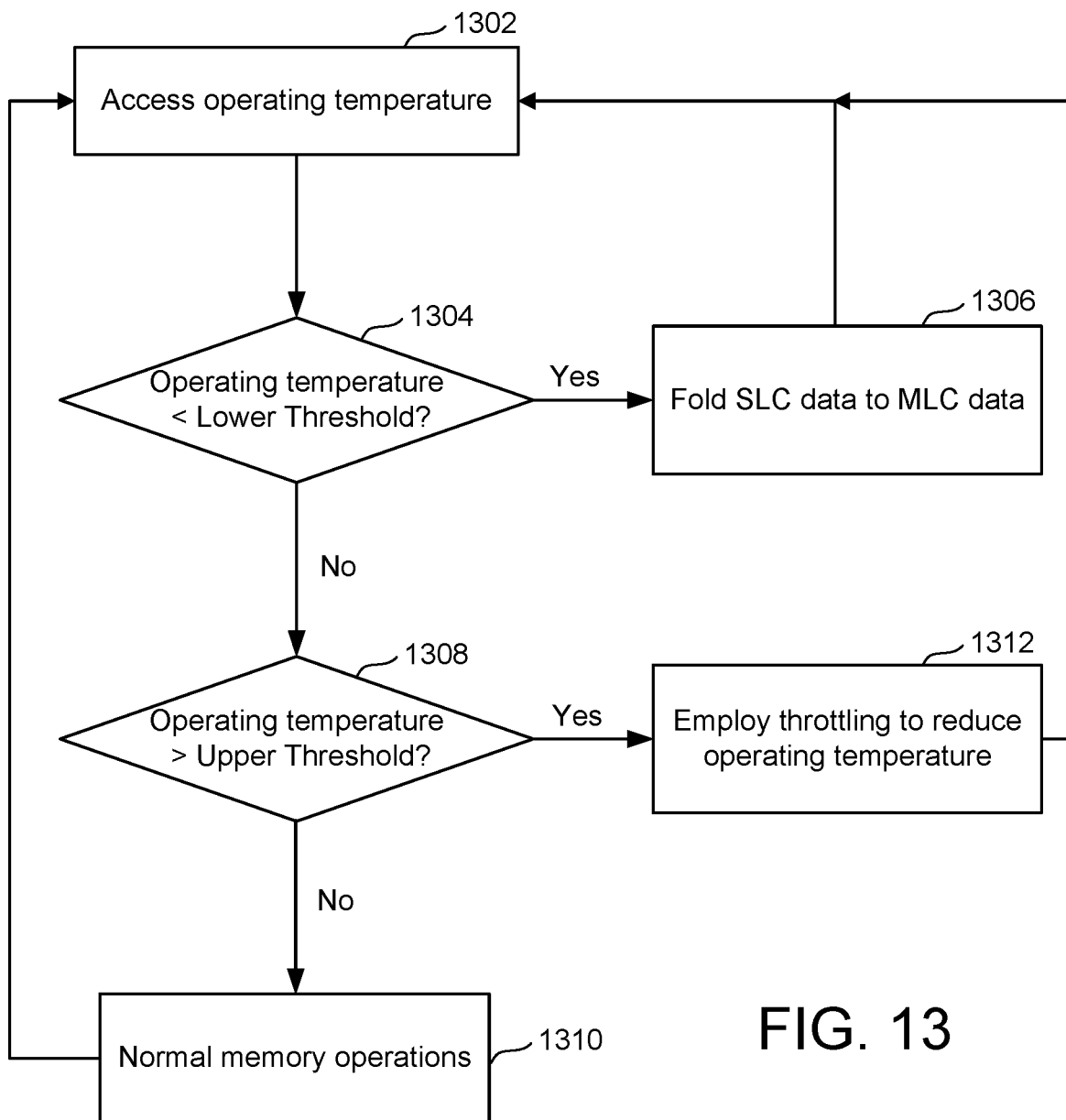
FIG. 13 depicts one embodiment of a flowchart of a process of operating non-volatile storage.

FIG. 13 depicts one embodiment of a flowchart of a process 1300 of operating non-volatile storage. In one embodiment, process 1300 is performed by controller 102. Process 1300 refers to a lower temperature threshold and an upper temperature threshold. In one embodiment, the lower and upper temperature thresholds define the first temperature range in step 602 (of process 600, 700 and/or 900). Recall that the folding operation may be performed when the operating temperature is outside of this range. In process 1300, the folding operation may be performed when the temperature is below the lower temperature threshold. For the sake of illustration, an example will be discussed in which the first temperature range is between 10 to 80 degrees C. Thus, the lower temperature threshold is 10 degrees C., and the upper temperature threshold is 80 degrees C., in this example.

Step 1302 include accessing an operating temperature of the non-volatile storage device. Temperature detection circuit 315 may be used to provide an operating temperature to the controller 102.

Step 1304 includes a determination of whether the operating temperature is lower than the lower threshold temperature. If the operating temperature is lower than the lower threshold temperature, then control passes to step 1306. Step 1306 includes folding SLC data in SLC cells into MLC data in MLC cells. Note that in some embodiments, there is a check for a still lower temperature such that the folding is not performed if the temperature is significantly below the lower temperature threshold. There may be times when there is not any SLC data to be folded, such that step 1306 is not necessarily always performed when the operating temperature is below the lower threshold. The process of folding the SLC data may heat the storage device. Therefore, folding the SLC data can avoid issuing dummy commands to heat the storage device.

The flow of process 1300 indicates that after folding the SLC data the operating temperature is again accessed. For the sake of discussion, it will be assumed that the operating temperature has now increased to being above the lower threshold. In this case, control passes to step 1308, which is a determination of whether the operating temperature is above the upper threshold.

While the operating temperature is between the lower and upper temperature thresholds, the storage device 100 performs normal memory operations, as indicated by step 1310. The normal memory operations may include read, write, and erase operations to both SLC cells and MLC cells. Note that in some embodiments, memory operations are performed on SLC cells even outside of this temperature range. Also, the folding operations are not limited to being performed in step 1306. Thus, folding operations can be performed in step 1310. Step 1310 may also include checking the data integrity of the data that was folded to the MLC cells (in step 1306).

In the event that it is determined in step 1308 that the operating temperature is above the upper temperature threshold, then control passes to step 1312. Step 1312 include employing thermal throttling to reduce the operating temperature of the storage device. Numerous thermal throttling techniques may be used to reduce the operating temperature of the storage device. One thermal throttling technique is to reduce the number of commands (e.g., read, write, erase) that are sent to the memory packages 104. For example, the scheduler in interface 228 may temporarily delay sending some of the commands to memory packages. Another technique is to reduce clock frequencies, such as to reduce the frequency of processors 220, 250. A combination of techniques can be used in step 1308.

Also, step 1312 can be divided into different categories of thermal throttling, such as light, medium and heavy throttling. Each category may be triggered by a successively higher temperature. For example, when the operating temperature first crosses the upper temperature threshold, light throttling is performed. If the operating temperature continues to rise, then medium throttling is performed. Medium throttling could involve a further reduction of the number of commands sent to the memory packages 104 relative to light throttling. If the temperature reaches a still higher level, the throttling could involve suspension of sending any commands to the memory packages 104.

Process 1300 can be used to extend the useful temperature operating range of the storage device. In the example in which the lower temperature threshold is 10 degrees C. and the upper temperature threshold is 80 degrees C., process 1300 allows the folding operating to be performed below 10 degrees C. Moreover, this example shows how the useful range can be greater than 70 degrees.

Process 1300 will now be contrasted with three examples in which step 1306 is not performed and the useful range is 70 degrees. In Example A, the lower threshold is 10 degrees and the upper threshold is 80 degrees. In the event that the operating temperature is below 10 degrees, MLC operations would not be performed. However, in step 1306 of the present example of process 1300, the SLC data could be folded to MLC data. In Example B, the lower threshold is 0 degrees and the upper threshold is 70 degrees. In the event that the operating temperature is above 70 degrees, thermal throttling would begin. In Example C, the lower threshold is 5 degrees and the upper threshold is 75 degrees. In the event that the operating temperature is below 5 degrees, the SLC data would not be folded to MLC data. Also, in the event that the operating temperature is above 75 degrees, thermal throttling would begin. Thus, process 1300 can be used to extend useful operating temperature by executing MLC operations a lower temperature and/or initiating thermal throttling at a higher temperatures than would otherwise be performed.

Figure 14:
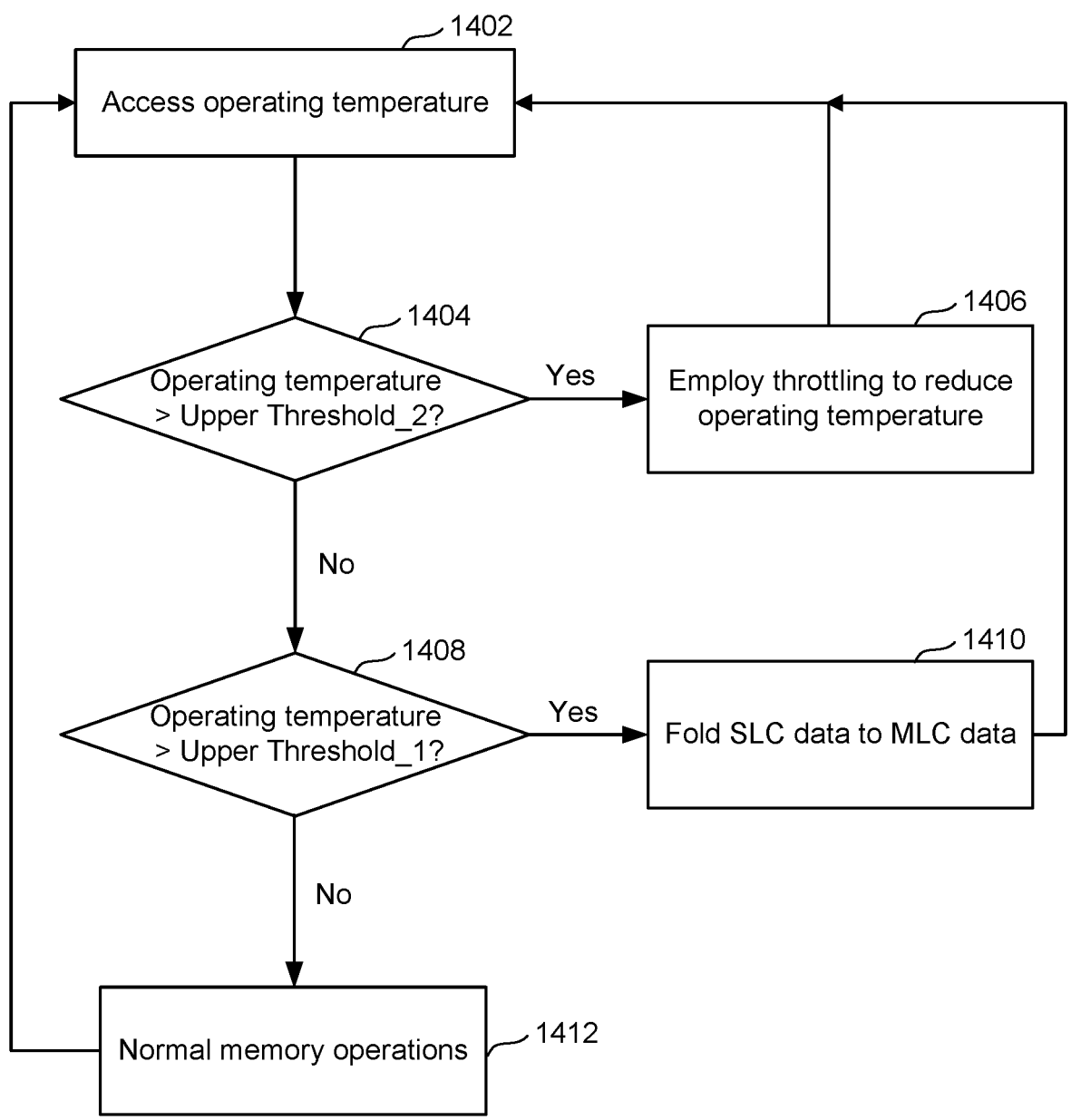
FIG. 14 depicts one embodiment of a flowchart of a process of operating non-volatile storage.

FIG. 14 depicts one embodiment of a flowchart of a process 1400 of operating non-volatile storage. In one embodiment, process 1400 is performed by controller 102. Process 1400 refers to a first upper lower temperature threshold (Upper Threshold_1) and a second upper temperature threshold (Upper Threshold_2). The second upper temperature threshold is a higher temperature than the first upper temperature threshold. In one embodiment, the first upper temperature threshold is at the upper end of the first temperature range in step 602 (of process 600, 700 and/or 900). Recall that the folding operation may be performed when the operating temperature is outside of this range. In process 1400, the folding operation may be performed when the temperature is above the first upper temperature threshold. For the sake of illustration, an example will be discussed in which the first temperature range is between 0 to 70 degrees C. Thus, the first upper temperature threshold is 70 degrees C., in this example.

Step 1402 include accessing an operating temperature of the non-volatile storage device. Temperature detection circuit 315 may be used to provide an operating temperature to the memory controller 102.

Step 1404 includes a determination of whether the operating temperature is above the second upper threshold temperature. If the operating temperature is above the second upper threshold temperature, then control passes to step 1406. Step 1406 includes employing thermal throttling to reduce the operating temperature of the storage device. Numerous thermal throttling techniques may be used to reduce the operating temperature of the storage device, as discussed in step 1312 of process 1300.

If the operating temperature is not above the second upper threshold temperature, then control passes to step 1408. Step 1408 includes a determination of whether the operating temperature is above the first upper threshold temperature. If the operating temperature is above the first upper threshold temperature, then control passes to step 1410. Step 1412 includes folding SLC data in SLC cells into MLC data in MLC cells. There may be times when there is not any SLC data to be folded, such that step 1412 is not necessarily always performed when the operating temperature is below the first upper threshold temperature.

While the operating temperature is between the lower and upper temperature thresholds, the storage device performs normal memory operations, as indicated by step 1412. The normal memory operations may include read, write, and erase operations to both SLC cells and MLC cells. Note that in some embodiments, memory operations are performed on SLC cells even outside of this temperature range. Also, the folding operations are not limited to being performed in step 1410. Thus, folding operations can be performed in step 1412. Step 1412 may also include checking the data integrity of the data that was folded to the MLC cells (in step 1410).

Process 1400 can be used to extend the useful temperature operating range of the storage device. In the example in which the lower temperature threshold is 0 degrees C. and the upper temperature threshold is 70 degrees C., process 1400 allows the folding operating to be performed above 70 degrees C. Moreover, this example shows how the useful range can be greater than 70 degrees. Process 1400 will now be contrasted with Example D, in which the lower threshold is 0 degrees and the upper threshold is 70 degrees. In the event that the operating temperature is above 70 degrees in Example D, the SLC data would not be folded to MLC data (as could be in step 1410 if process 1400 were performed).

Note that process 1300 and 1400 may be combined. For example, folding of SLC data to MLC data may be added to process 1400 when the operating temperature is below a certain temperature. In Example E, the lower threshold is 10 degrees and the upper threshold is 80 degrees. In the event that the operating temperature is below 10 degrees, MLC operations would not be performed in Example E. However, folding of SLC data to MLC data may be performed below 10 degrees with this aforementioned modification to process 1400.

A first embodiment includes, an apparatus comprising an apparatus comprising non-volatile memory cells and a control circuit. The control circuit is configured to fold SLC data stored in a first group of the non-volatile memory cells at one bit per memory cell to MLC data stored in a second group of the non-volatile memory cells at multiple bits per memory cell while an operating temperature is outside a first temperature range. The control circuit is configured to check data integrity of the MLC data in the second group after the operating temperature is within a second temperature range that is within the first temperature range. The control circuit is configured to fold the SLC data in the first group to MLC data in a third group of the non-volatile memory cells responsive to the MLC data in the second group failing the data integrity check.

In a second embodiment, and in furtherance of the first embodiment, the control circuit is further configured to maintain the SLC data in the first group after folding the SLC data in the first group to the MLC data in the second group. The control circuit is further configured to invalidate the SLC data in the first group responsive to the MLC data in the second group passing the data integrity check.

In a third embodiment, and in furtherance of either the first or second embodiments, the control circuit is further configured to maintain the MLC data in the second group responsive to the MLC data in the second group passing the data integrity check. The control circuit is further configured to invalidate the MLC data in the second group responsive to the MLC data in the second group failing the data integrity check.

In a fourth embodiment, and in furtherance of any of the first to third embodiments, the control circuit is further configured to store a mapping of one or more logical addresses to one or more physical locations of the first group of the non-volatile memory cells. The control circuit is further configured to change the mapping of the one or more logical addresses from the one or more physical locations of the first group to one or more physical locations of the second group responsive to the MLC data in the second group passing the data integrity check.

In a fifth embodiment, and in furtherance of any of the first to fourth embodiments, the control circuit is further configured to read the SLC data in the first group responsive to a first read request from a host prior to the MLC data in the second group passing the data integrity check. The first read request for data is associated with one or more logical addresses. The control circuit is further configured to read the MLC data in the second group responsive to a second read request from the host after the MLC data in the second group passes the data integrity check. The second read request for the data associated with the one or more logical addresses.

In a sixth embodiment, and in furtherance of any of the first to fifth embodiments, the first temperature range comprises a first lower temperature threshold, and the second temperature range comprises a second lower temperature threshold that is greater than the first lower temperature threshold. The control circuit is further configured to fold the SLC data in the first group to the MLC data in the second group while the operating temperature is below the first lower temperature threshold. The control circuit is further configured to check the data integrity of the MLC data in the second group after the operating temperature is above the second lower temperature threshold.

In a seventh embodiment, and in furtherance of any of the first to sixth embodiments, the first temperature range comprises a first upper temperature threshold, and the second temperature range comprises a second upper temperature threshold that is lower than the first upper temperature threshold. The control circuit is configured to fold the SLC data in the first group to the MLC data in the second group while the operating temperature is above the first upper temperature threshold. The control circuit is configured to check the data integrity of the MLC data in the second group after the operating temperature is below the second upper temperature threshold.

One embodiment includes a method of operating non-volatile storage. The method comprises storing a first mapping from one or more logical addresses to one or more physical locations of a first group of non-volatile memory cells in the non-volatile storage. The method comprises folding SLC data stored in the first group at one bit per memory to MLC data stored in a second group of non-volatile memory cells in the non-volatile storage at multiple bits per memory cell while an operating temperature of the non-volatile storage is below a first temperature threshold. The method comprises storing a second mapping from the one or more logical addresses to one or more physical locations of the second group of non-volatile memory cells. The method comprises checking data integrity of the MLC data in the second group after the operating temperature is above a second temperature threshold that is at least has high as the first temperature threshold. The method comprises invalidating the first mapping and maintaining the second mapping responsive to the MLC data in the second group passing the data integrity check.

One embodiment includes a non-volatile storage device comprising non-volatile memory cells and a control circuit. The control circuit is configured to copy SLC data in a first group of the non-volatile memory cells to MLC data in a second group of the non-volatile memory cells while an operating temperature is outside a first temperature range. The control circuit is configured to set logical address to physical address mappings to return the SLC data in the first group in response to a request to read data for one or more logical addresses. The control circuit is configured to check data integrity of the MLC data in the second group after the operating temperature is within a second temperature range that is within the first temperature range. The control circuit is configured to set the logical address to physical address mappings to return the MLC data in the second group in response to a request to read data for the one or more logical addresses, if the data integrity check indicates the MLC data is within an error tolerance. The control circuit is configured to copy the SLC data in the first group to MLC data in a third group of the non-volatile memory cells, if the data integrity check indicates the MLC data is outside of the error tolerance.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
a control circuit configured to:
fold single level cell (SLC) data stored in a first group of non-volatile memory cells at one bit per memory cell to multi level cell (MLC) data stored in a second group of non-volatile memory cells at multiple bits per memory cell while an operating temperature of the second group is outside a first temperature range having a first lower temperature threshold and a first upper temperature threshold;
check data integrity of the MLC data in the second group after the operating temperature of the second group is within a second temperature range having a second lower temperature threshold that exceeds the first lower temperature threshold and a second upper temperature threshold that is less than the first upper temperature threshold;
maintain the MLC data in the second group responsive to the MLC data in the second group passing the data integrity check; and
invalidate the MLC data in the second group responsive to the MLC data in the second group failing the data integrity check.

2. The apparatus of claim 1, wherein the control circuit is further configured to:
provide the SLC data in the first group to a host responsive to a first read request from the host prior to the MLC data in the second group passing the data integrity check, the first read request for data associated with one or more logical addresses; and
provide the MLC data in the second group to the host responsive to a second read request from the host after the MLC data in the second group passes the data integrity check, the second read request for the data associated with the one or more logical addresses.

3. The apparatus of claim 1, wherein the control circuit is further configured to:
maintain the SLC data in the first group after folding the SLC data in the first group to the MLC data in the second group; and
invalidate the SLC data in the first group responsive to the MLC data in the second group passing the data integrity check.

4. The apparatus of claim 1, wherein the control circuit is further configured to:
fold the SLC data in the first group to MLC data in a third group of the non-volatile memory cells responsive to the MLC data in the second group failing the data integrity check.

5. The apparatus of claim 1, wherein the control circuit is further configured to:
store a mapping from a virtual address to an intermediate physical address of the first group of non-volatile memory cells;
store a mapping from the virtual address to a final physical address of the second group of non-volatile memory cells in response to folding the SLC data to the MLC data in the second group; and
store a flag that indicates that the intermediate physical address is valid prior to the MLC data in the second group passing the data integrity check.

6. The apparatus of claim 5, wherein the control circuit is further configured to:
update the flag to indicate that the intermediate physical address is no longer valid in response to the MLC data in the second group passing the data integrity check.

7. The apparatus of claim 1, wherein:
the first temperature range has a second upper temperature threshold that is a higher temperature than the first upper temperature threshold; and
the control circuit is further configured to employ throttling to reduce the operating temperature in response to the operating temperature being above the second upper temperature threshold.

8. The apparatus of claim 1, wherein the control circuit is further configured to:
fold the SLC data in the first group to the MLC data in the second group while the operating temperature is below the first lower temperature threshold; and
check the data integrity of the MLC data in the second group after the operating temperature is above the second lower temperature threshold.

9. The apparatus of claim 1, wherein the control circuit is further configured to:
fold the SLC data in the first group to the MLC data in the second group while the operating temperature is above the first upper temperature threshold; and
check the data integrity of the MLC data in the second group after the operating temperature is below the second upper temperature threshold.

10. A method of operating non-volatile storage, the method comprising:
storing a first mapping from one or more logical addresses to one or more physical locations of a first group of non-volatile memory cells in the non-volatile storage;
folding single level cell (SLC) data stored in the first group at one bit per memory to multi level cell (MLC) data stored in a second group of non-volatile memory cells in the non-volatile storage at multiple bits per memory cell while an operating temperature of the second group of non-volatile memory cells is below a first temperature;
storing a second mapping from the one or more logical addresses to one or more physical locations of the second group of non-volatile memory cells;
checking data integrity of the MLC data in the second group after the operating temperature of the second group is above a second temperature that is higher than the first temperature;
invalidating the second mapping responsive to the MLC data in the second group failing the data integrity check; and
maintaining the second mapping responsive to the MLC data in the second group passing the data integrity check.

11. The method of claim 10, further comprising:
determining that the SLC data stored in the first group is not to be folded to MLC data into the second group in response to the operating temperature of the second group being below a temperature that is lower than the first temperature.

12. The method of claim 10, further comprising:
receiving a first request to read data associated with the one or more logical addresses after folding the SLC data in the first group to the MLC data in the second group but prior to the MLC data in the second group passing the data integrity check;
accessing the first mapping; and reading the SLC data in the first group, based on the first mapping, to satisfy the first request.

13. The method of claim 10, further comprising:
receiving a second request to read data associated with the one or more logical addresses after the MLC data in the second group passes the data integrity check;
accessing the second mapping; and
reading the MLC data in the second group, based on the second mapping, to satisfy the second request.

14. The method of claim 10, further comprising:
employing throttling to reduce the operating temperature of the second group of non-volatile memory in response to the operating temperature being above a third temperature.

15. A non-volatile storage device comprising:
a control circuit configured to be connected to non-volatile memory cells, the control circuit configured to:
access data stored in a first group of the non-volatile memory cells at one bit per memory cell;
store the data at multiple bits per memory cell in a second group of the non-volatile memory cells while an operating temperature of the second group is outside a first temperature range having a first lower temperature and a first upper temperature;
check data integrity of the data in the second group after the operating temperature of the second group is within a second temperature range having a second lower temperature that exceeds the first lower temperature and a second upper temperature that is less than the first upper temperature;
return the data in the second group to a host in response to a request from the host to read data for one or more logical addresses if the data integrity check indicates a bit error rate of the data in the second group is less than a threshold; and
return the data in the first group to the host in response to a request from the host to read data for the one or more logical addresses if the bit error rate of the data in the second group is not less than the threshold.

16. The non-volatile storage device of claim 15, wherein the control circuit is further configured to:
maintain the data in the first group after storing the data from the first group to the second group; and
erase the data in the first group if the bit error rate of the data in the second group is less than the threshold.

17. The non-volatile storage device of claim 15, wherein the control circuit is further configured to:
maintain the data in the second group if the bit error rate of the data in the second group is less than the threshold; and
erase the data in the second group if the bit error rate of the data in the second group is not less than the threshold.

18. The non-volatile storage device of claim 15, wherein the control circuit is further configured to:
copy the data in the first group to the data in the second group while the operating temperature is below the first lower temperature; and
check the data integrity of the data in the second group after the operating temperature is above the second lower temperature.

19. The non-volatile storage device of claim 15, wherein the control circuit is configured to:
copy the data in the first group to the data in the second group while the operating temperature is above the first upper temperature; and
check the data integrity of the data in the second group after the operating temperature is below the second upper temperature.

20. The non-volatile storage device of claim 15, further comprising:
means for storing the data from the first group into a third group of the non-volatile memory cells at multiple bits per memory cell in response to the bit error rate of the data in the second group exceeding the threshold.

* * * * *